US012598978B2

(12) United States Patent
Kim et al.

(10) Patent No.: US 12,598,978 B2
(45) Date of Patent: Apr. 7, 2026

(54) SEMICONDUCTOR DEVICE HAVING A SOURCE/DRAIN CONTACT CONNECTED TO A BACK-SIDE POWER RAIL BY A LANDING PAD AND A THROUGH ELECTRODE

(71) Applicant: SAMSUNG ELECTRONICS CO., LTD., Suwon-si (KR)

(72) Inventors: Ji Hyung Kim, Suwon-si (KR); Jae Hee Oh, Suwon-si (KR); Je Gwan Hwang, Suwon-si (KR); Jeong Hoon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 18/107,070

(22) Filed: Feb. 8, 2023

(65) Prior Publication Data

US 2023/0317596 A1    Oct. 5, 2023

(30) Foreign Application Priority Data

Mar. 31, 2022    (KR) ........................ 10-2022-0040526

(51) Int. Cl.
| | |
|---|---|
| *H01L 23/522* | (2006.01) |
| *H01L 23/48* | (2006.01) |
| *H01L 23/528* | (2006.01) |
| *H10D 84/01* | (2025.01) |
| *H10D 84/03* | (2025.01) |
| *H10D 84/83* | (2025.01) |

(52) U.S. Cl.
CPC ........ *H01L 23/5226* (2013.01); *H01L 23/481* (2013.01); *H01L 23/5286* (2013.01);
(Continued)

(58) Field of Classification Search
CPC ........... H10D 84/0158; H10D 84/0193; H10D 84/834; H10D 84/853; H10D 86/011;
(Continued)

(56) References Cited

U.S. PATENT DOCUMENTS

| | | | |
|---|---|---|---|
| 10,985,057 B2 | 4/2021 | Jourdain et al. | |
| 2020/0373331 A1* | 11/2020 | Kim ..................... | H10D 86/201 |

(Continued)

FOREIGN PATENT DOCUMENTS

EP          4002435 A1    5/2022

OTHER PUBLICATIONS

European Search report issued Aug. 1, 2023, of the corresponding EP Patent Application No. 22213373.8.
(Continued)

*Primary Examiner* — Younes Boulghassoul
(74) *Attorney, Agent, or Firm* — Muir Patent Law, PLLC

(57) ABSTRACT

A semiconductor device includes a substrate including a first surface and a second surface opposite to the first surface; an active pattern extending in a first direction on the first surface of the substrate; a first source/drain contact including a first portion connected to a source/drain region of the active pattern, and a second portion extending from the first portion in the first direction or in a second direction intersecting the first direction; a power rail providing a voltage on the second surface of the substrate; a through electrode connected to the power rail and penetrating the substrate; and a landing pad connecting the through electrode and the second portion of the source/drain contact.

20 Claims, 19 Drawing Sheets

(52) U.S. Cl.
CPC ....... *H10D 84/0149* (2025.01); *H10D 84/038* (2025.01); *H10D 84/83* (2025.01); *H10D 84/834* (2025.01)

(58) Field of Classification Search
CPC ..... H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 30/6729; H10D 64/251–259; H10D 84/0149; H10D 84/0186; H10B 12/36; H10B 12/056; H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/528; H01L 23/481; H01L 23/535; H01L 23/5384; H01L 23/5386; H01L 23/49827; H01L 29/4175; H01L 2225/06541–06544; H01L 2225/06548; H01L 21/76898; H01L 21/486
See application file for complete search history.

(56) References Cited

U.S. PATENT DOCUMENTS

| | | | | |
|---|---|---|---|---|
| 2021/0028112 | A1* | 1/2021 | Kim | H10D 84/038 |
| 2021/0143127 | A1 | 5/2021 | Jain et al. | |
| 2021/0280585 | A1 | 9/2021 | Jin et al. | |
| 2021/0305130 | A1* | 9/2021 | Cho | H01L 21/76898 |
| 2021/0335709 | A1 | 10/2021 | Wang et al. | |
| 2021/0358891 | A1 | 11/2021 | Chuang et al. | |
| 2021/0375722 | A1* | 12/2021 | Kim | H10D 84/038 |
| 2021/0376071 | A1 | 12/2021 | Liu et al. | |
| 2021/0391318 | A1 | 12/2021 | Peng et al. | |
| 2021/0408287 | A1* | 12/2021 | Hiblot | H10D 84/0193 |
| 2022/0020666 | A1* | 1/2022 | Van Dal | H10D 30/6211 |
| 2022/0037236 | A1* | 2/2022 | Seo | H01L 23/5386 |
| 2022/0059460 | A1* | 2/2022 | Do | H01L 23/485 |
| 2022/0059571 | A1* | 2/2022 | Baek | H10D 84/907 |
| 2022/0068805 | A1* | 3/2022 | Lee | H10D 30/63 |
| 2022/0122970 | A1* | 4/2022 | Do | H01L 23/50 |
| 2022/0157723 | A1* | 5/2022 | Park | H01L 23/5286 |
| 2022/0208757 | A1* | 6/2022 | Do | H01L 23/535 |
| 2022/0384311 | A1* | 12/2022 | Oh | H10D 84/038 |
| 2022/0399224 | A1* | 12/2022 | Xie | H01L 21/743 |
| 2022/0399251 | A1* | 12/2022 | Cho | H01L 23/522 |
| 2023/0178433 | A1* | 6/2023 | Xie | H01L 23/535 257/621 |
| 2023/0253293 | A1* | 8/2023 | Cho | H10D 30/6735 257/732 |
| 2023/0253322 | A1* | 8/2023 | Choi | H01L 23/481 257/369 |
| 2023/0282722 | A1* | 9/2023 | Frougier | H10D 84/0128 257/288 |
| 2023/0290705 | A1* | 9/2023 | Lee | H01L 23/5226 |

OTHER PUBLICATIONS

European Office Action issued Aug. 11, 2023, of the corresponding EP Patent Application No. 22213373.8.

* cited by examiner

SEMICONDUCTOR DEVICE HAVING A SOURCE/DRAIN CONTACT CONNECTED TO A BACK-SIDE POWER RAIL BY A LANDING PAD AND A THROUGH ELECTRODE

CROSS-REFERENCE TO RELATED APPLICATION

This application claims priority under 35 U.S.C. § 119 from Korean Patent Application No. 10-2022-0040526, filed on Mar. 31, 2022, in the Korean Intellectual Property Office, the disclosure of which is incorporated herein by reference in its entirety.

BACKGROUND

1. Field

The present disclosure relates to a semiconductor device.

2. Description of the Related Art

As the electronic industry develops to a high degree, the demand for semiconductor devices is increasing. For example, there is an increasing demand for high reliability, high speed, and/or multi-functionality for the semiconductor devices. In order to satisfy such required characteristics, structures inside the semiconductor device are becoming more complicated and highly integrated.

SUMMARY

According to an embodiment, a semiconductor device may include a substrate including a first surface and a second surface opposite to the first surface; an active pattern extending in a first direction, on the first surface of the substrate; a first source/drain contact including a first portion connected to a source/drain region of the active pattern, and a second portion extending from the first portion in the first direction or in a second direction intersecting the first direction; a power rail providing a voltage onto the second surface of the substrate; a through electrode connected to the power rail and penetrating the substrate; and a landing pad connecting the through electrode and the second portion of the source/drain contact.

According to an embodiment, a semiconductor device may include a substrate including a first surface, and a second surface opposite to the first surface; a first active pattern extending in a first direction, on the first surface of the substrate; a second active pattern on the first surface of the substrate, the second active pattern is spaced apart from the first active pattern in a second direction intersecting the first direction, and extends in the first direction; a third active pattern on the first surface of the substrate, the third active pattern is spaced apart from the first active pattern in the first direction and extends in the first direction; a gate electrode extending in the second direction, on the first active pattern and the second active pattern; a source/drain contact connected to a source/drain region on one side of the gate electrode of the first active pattern in the first direction; a power rail providing a voltage onto the second surface of the substrate; a through electrode connected to the power rail and penetrating the substrate; and a landing pad which comes into contact with the source/drain contact and the through electrode, between the first active pattern and the second active pattern, or between the second active pattern and the third active pattern, wherein the source/drain contact includes a first portion that comes into contact with the source/drain region, and a second portion that extends from the first portion in the first direction or the second direction to come into contact with the landing pad.

According to an embodiment, a semiconductor device may include a substrate including a first surface, and a second surface opposite to the first surface; an active pattern extending in a first direction on the first surface of the substrate; a field insulating film wrapping at least part of a side wall of the active pattern; a gate electrode extending in a second direction intersecting the first direction, on the active pattern; a source/drain contact including a first portion connected to a source/drain region of the active pattern, and a second portion extending from the first portion in the first direction or the second direction; a silicide film between the source/drain region and the source/drain contact; a power rail providing a voltage onto the second surface of the substrate; a back wiring connected to the power rail on the second surface of the substrate; a through electrode connected to the power rail and penetrating the substrate and the field insulating film; a landing pad on the field insulating film, the landing pad coming into contact with the through electrode and the second portion of the source/drain contact and including the same material as the gate electrode; and a front wiring connected to the source/drain contact, on the first surface of the substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
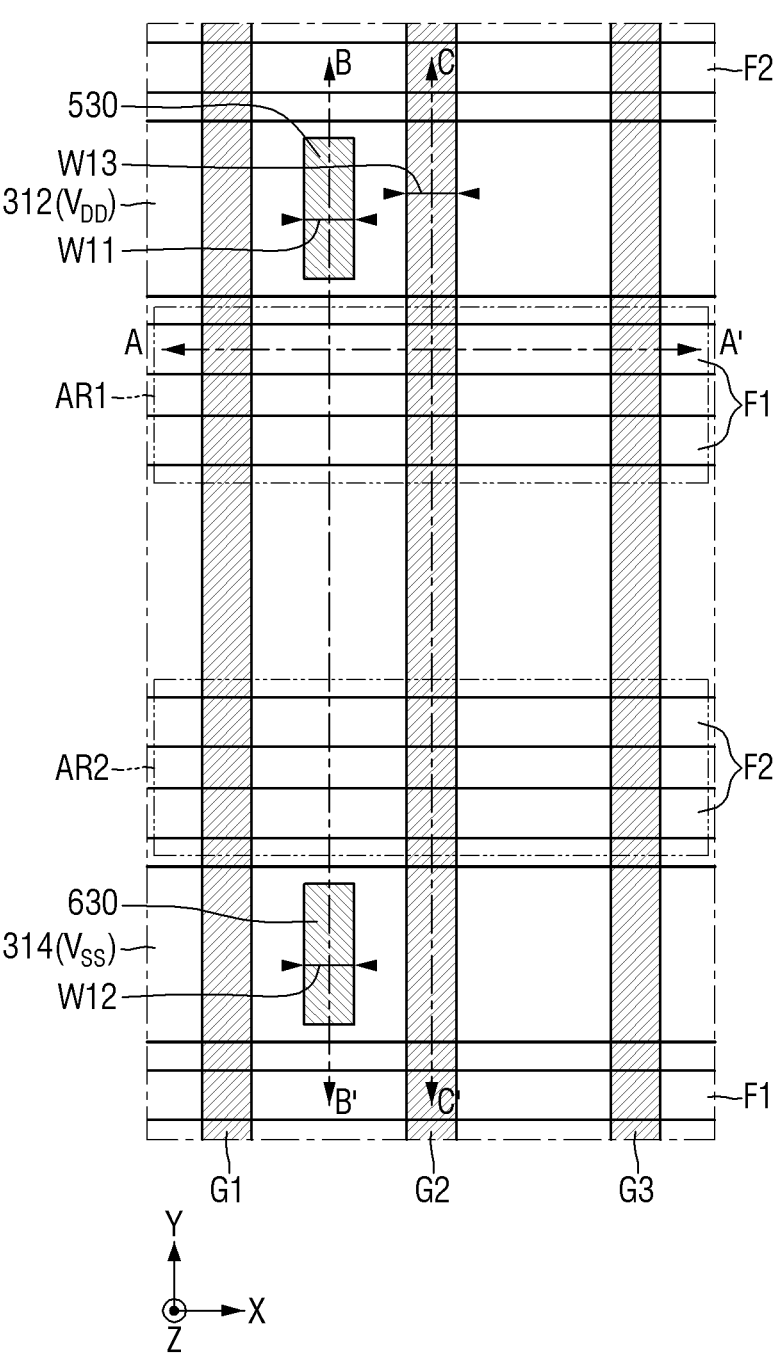
FIG. 1 is a schematic layout diagram of a semiconductor device according to some embodiments.
Figure 2:
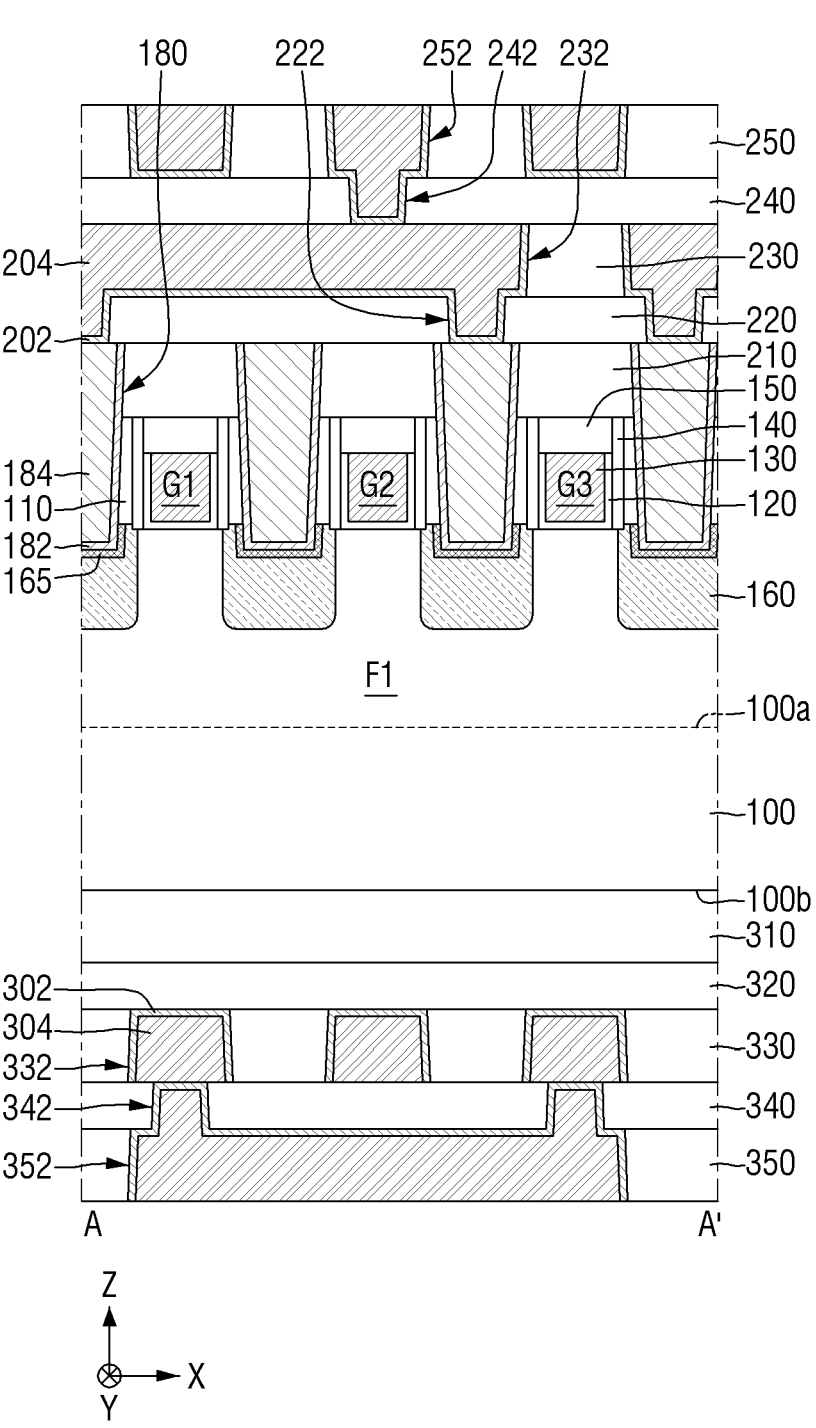
FIG. 2 is a cross-sectional view taken along line A-A' of FIG. 1.
Figure 3:
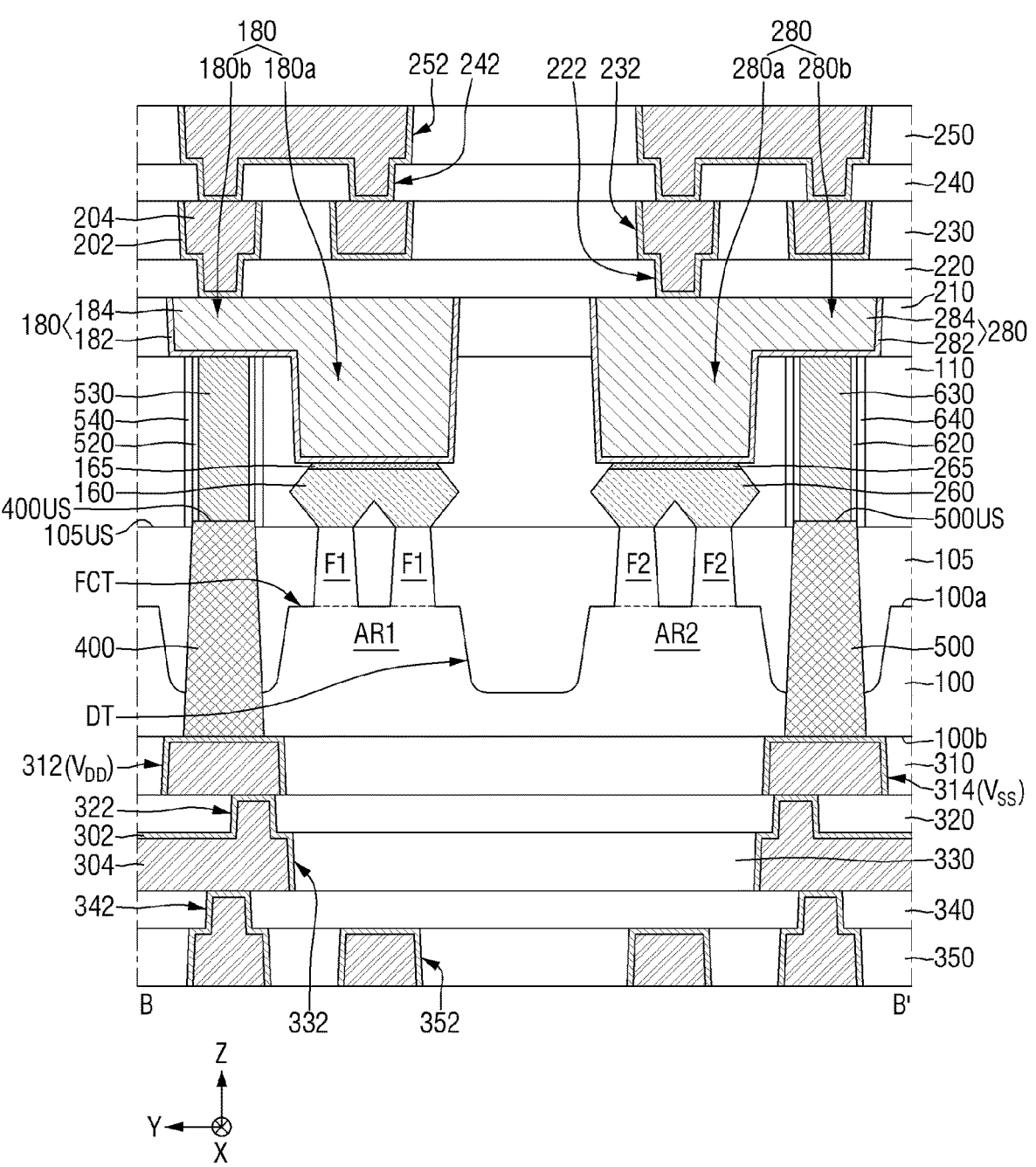
FIG. 3 is a cross-sectional view taken along line B-B' of FIG. 1.
Figure 4:
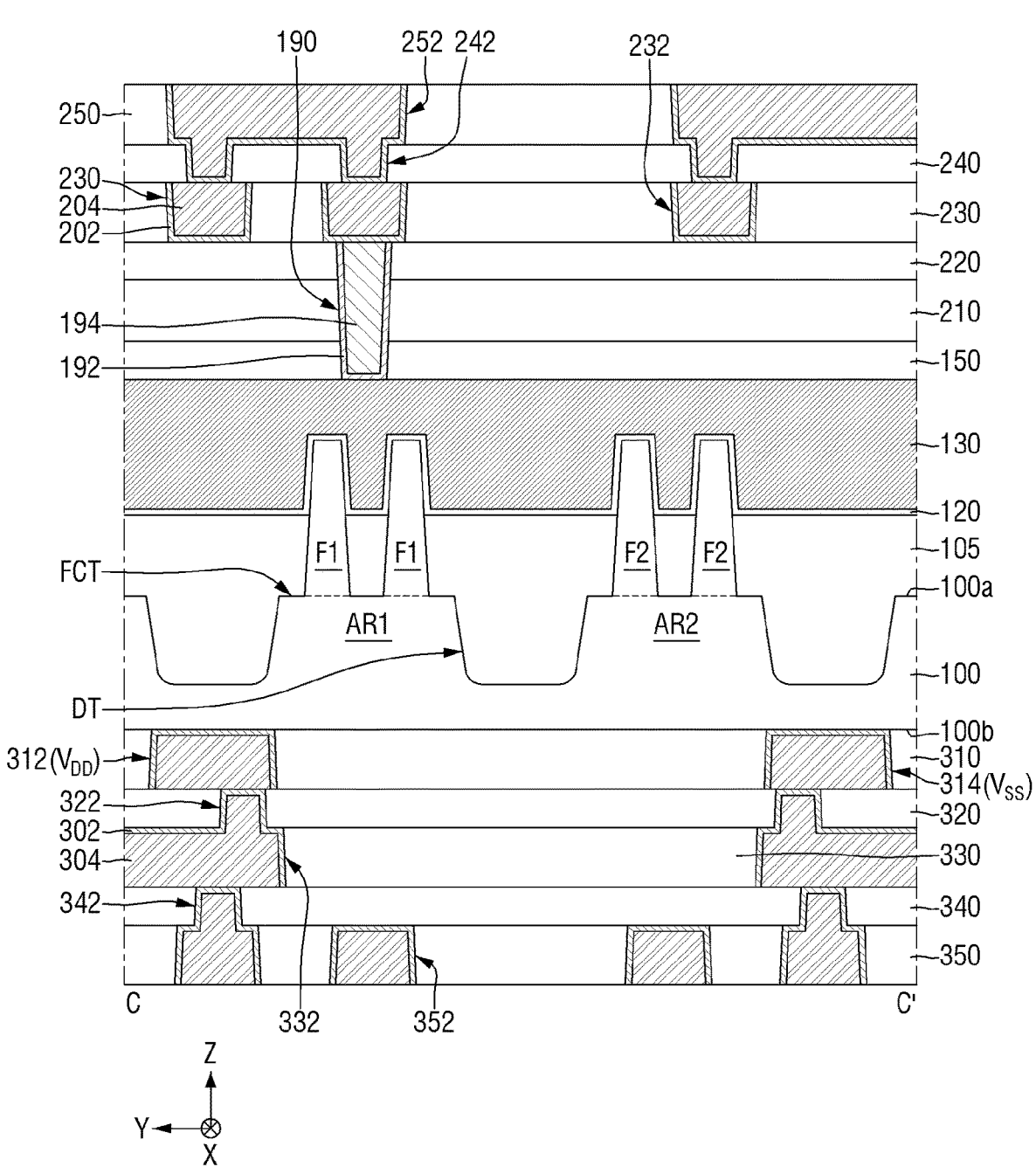
FIG. 4 is a cross-sectional view taken along line C-C' of FIG. 1.

FIG. 1 is a schematic layout diagram of a semiconductor device according to some embodiments. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIGS. 1-3, a semiconductor device according to some embodiments may include a substrate 100, active patterns F1 and F2, gate electrodes G1 to G3, first and second source/drain contacts 180 and 280, a gate contact 190, first and second front vias 222 and 242, first and second front wirings 232 and 252, first and second power rails 312 and 314, first and second through vias 400 and 500, and first and second landing pads 530 and 630, first and second back vias 322 and 342, and first and second back wirings 332 and 352.

For example, the substrate 100 may be bulk silicon or silicon-on-insulator (SOI). In another example, the substrate 100 may be a silicon substrate, or may include other materials, e.g., silicon germanium, silicon germanium on insulator (SGOI), indium antimonide, lead tellurium compounds, indium arsenide, indium phosphide, gallium arsenide or gallium antimonide The substrate 100 may include a first surface 100a and a second surface 100b that are opposite to each other. In the embodiments to be described below, the first surface 100a may be referred to as a front side of the substrate 100, and the second surface 100b may be referred to as a back side of the substrate 100.

The substrate 100 may include a first active region AR1, a second active region AR2, and a field region between the first active region AR1 and the second active region AR2. The field region may form a boundary with the first active region AR1 and the second active region AR2. The first active region AR1 and the second active region AR2 may be spaced apart from each other, e.g., along the Y-direction. The first active region AR1 and the second active region AR2 may be separated by the field region.

The field region may be defined by a substrate trench DT formed inside the substrate 100. The substrate trench DT may be a trench deeper than a fin cut trench FCT. The substrate trench DT may extend, e.g., lengthwise, in a first direction, e.g., in the X-direction, to separate the first active region AR1 and the second active region AR2 in a second direction, e.g., in the Y-direction.

Semiconductor elements (e.g., transistors) having different conductivity types from each other may be formed on the first active region AR1 and the second active region AR2. For example, an NMOS transistor may be formed on the first active region AR1 and a PMOS transistor may be formed on the second active region AR2. As another example, the PMOS transistor may be formed on the first active region AR1 and the NMOS transistor may be formed on the second active region AR2.

The active patterns F1 and F2 may be formed on the substrate 100. For example, the first active pattern F1 may be formed on the first active region AR1, and the second active pattern F2 may be formed on the second active region AR2. The active patterns F1 and F2 may extend in the first direction, e.g., in the X-direction. The active patterns F1 and F2 may be defined by the fin cut trench FCT. The fin cut trench FCT may define side walls of the active patterns F1 and F2. The active patterns F1 and F2 may be spaced apart from each other in a second direction, e.g., in the Y-direction, which intersects the first direction, e.g., the X-direction. In some embodiments, the active patterns F1 and F2 may each include a fin-shaped pattern protruding from the first surface 100a of the substrate 100.

The active patterns F1 and F2 may be a part of the substrate 100, or may include an epitaxial layer that is grown from the substrate 100. For example, the active patterns F1 and F2 may include, e.g., silicon or germanium, which is an elemental semiconductor material.

In another example, the active patterns F1 and F2 may include a compound semiconductor, e.g., a group IV-IV compound semiconductor or a group III-V compound semiconductor. For example, the group IV-IV compound semiconductor may include a binary compound or a ternary compound including at least two or more of, e.g., carbon (C), silicon (Si), germanium (Ge) and tin (Sn), or a compound obtained by doping these elements with a group IV element. For example, the group III-V compound semiconductor may be at least one of a binary compound, a ternary compound or a quaternary compound formed by combining at least one of, e.g., aluminum (Al), gallium (Ga) and indium (In) as a group III element, with one of, e.g., phosphorus (P), arsenic (As) and antimony (Sb) as a group V element.

As an example, the first active pattern F1 may include the same material as that of the second active pattern F2. As another example, the first active pattern F1 may include a different material from the second active pattern F2. Any suitable number and arrangement of the first active patterns F1 placed in the first active region AR1 and any suitable number and arrangement of the second active patterns F2 placed in the second active region AR2 may be implemented.

A field insulating film 105 may be formed on the first surface 100a of the substrate 100. The field insulating film 105 may be formed on a part of the side wall of the first active pattern F1 and a part of the side wall of the second active pattern F2. The field insulating film 105 may surround at least a part of the side wall of the first active pattern F1 and at least a part of the side wall of the second active pattern F2. The field insulating film 105 may fill the substrate trench DT. The field insulating film 105 may fill a part of the fin cut trench FCT. The active patterns F1 and F2 may protrude upward from, e.g., above, the upper surface of the field insulating film 105. The field insulating film 105 may include, e.g., an oxide film, a nitride film, an oxynitride film or a combination film thereof.

The gate electrodes G1 to G3 may be formed on the active patterns F1 and F2. The gate electrodes G1 to G3 may intersect the active patterns F1 and F2. The gate electrodes G1 to G3 may extend, e.g., lengthwise, in the second direction, e.g., in the Y-direction. The gate electrodes G1 to G3 may be spaced apart from each other in the first direction, e.g., in the X-direction. The second gate electrode G2 may be placed between the first gate electrode G1 and the third gate electrode G3.

Each of the gate electrodes G1 to G3 may include a gate conductive film 130. For example, the gate conductive film 130 may include, e.g., at least one of Ti, Ta, W, Al, Co, and a combination thereof. In another example, the gate conductive film 130 may include, e.g., silicon, silicon germanium, or the like instead of metal.

Although the gate conductive film 130 is shown as a single film, the gate conductive film 130 may be formed by stacking a plurality of conductive materials. For example, the gate conductive film 130 may include a work function adjusting film that adjusts a work function, and a filling conductive film that fills a space formed by the work function adjusting film. The work function control film may include, e.g., at least one of TiN, TaN, TiC, TaC, TiAlC, and combinations thereof. The filling conductive film may include, e.g., W or Al. Such a gate conductive film 130 may be formed by, e.g., a replacement process.

A gate dielectric film 120 may be interposed between the gate conductive film 130 and a corresponding one of the active patterns F1 and F2. For example, as illustrated in FIG. 2, the gate dielectric film 120 may extend along the side walls and bottom surface of the gate conductive film 130. In another example, the gate dielectric film 120 may extend along a bottom surface of the gate conductive film 130, but may not extend along the side wall of the gate conductive film 130.

The gate dielectric film 120 may be interposed between the field insulating film 105 and the gate conductive film 130. The gate dielectric film 120 may be formed along the profiles of the active patterns F1 and F2 protruding upward from the field insulating film 105 and the upper surface of the field insulating film 105.

The gate dielectric film 120 may include, e.g., at least one of silicon oxide, silicon oxynitride, silicon nitride, and high dielectric constant materials having a higher dielectric constant than that of silicon oxide. The high dielectric constant material may include, e.g., hafnium oxide.

A gate spacer 140 may be formed on the substrate 100 and the field insulating film 105. The gate spacer 140 may extend along opposite, e.g., both, side walls of the gate conductive film 130. The gate spacer 140 may be placed on a long side wall of the gate conductive film 130. For example, the gate spacer 140 may extend in the second direction, e.g., in the Y-direction. The gate spacer 140 may include, e.g., at least one of silicon oxide, silicon nitride, silicon oxynitride, and combinations thereof.

A gate capping pattern 150 may extend along the upper surface of the gate conductive film 130. For example, as illustrated I FIG. 2, the gate capping pattern 150 may extend in the second direction, e.g., in the Y-direction, to cover the upper surface of the gate conductive film 130. In another example, the gate capping pattern 150 may be placed to cover upper surfaces of both the gate conductive film 130 and the gate spacer 140. The gate capping pattern 150 may include, e.g., at least one of silicon oxide, silicon nitride, silicon oxynitride, and combinations thereof.

A first source/drain region 160 may be placed on the first active pattern F1. The first source/drain region 160 may be formed inside the first active pattern F1 on opposite, e.g., both, sides of the gate conductive film 130. The first source/drain region 160 may be placed between gate conductive films 130 adjacent to each other. The first source/drain region 160 may be spaced apart from the gate conductive film 130 by the gate spacer 140.

The first source/drain region 160 may include an epitaxial layer formed inside the first active pattern F1. In some embodiments, the first active pattern F1 may share the first source/drain region 160. For example, the first source/drain region 160 may be a merged epitaxial layer.

When the semiconductor device formed in the first active region AR1 is an NFET, the first source/drain region 160 may include n-type impurities or impurities for preventing diffusion of n-type impurities. For example, the first source/drain region 160 may include at least one of P, Sb, As or a combination thereof.

A second source/drain region 260 may be placed on the second active pattern F2. The second source/drain region 260 may be formed inside the active pattern F2 on opposite, e.g., both, sides of the gate conductive film 130. The second source/drain region 260 may be placed between gate conductive films 130 adjacent to each other. The second source/drain region 260 may be spaced apart from the gate conductive film 130 by the gate spacer 140.

The second source/drain region 260 may include an epitaxial layer formed inside the second active pattern F2. In some embodiments, the second active pattern F2 may share the second source/drain region 260. For example, the second source/drain region 260 may be a merged epitaxial layer.

When the semiconductor device formed in the second active region AR2 is a PFET, the second source/drain region 260 may include p-type impurities or impurities for preventing diffusion of p-type impurities. For example, the second source/drain region 260 may include at least one of B, C, In, Ga, and Al or a combination thereof. Although the first source/drain region 160 and the second source/drain region 260 are each shown as a single film, the first source/drain region 160 and the second source/drain region 260 may be formed of multi-films including impurities having different concentrations from each other.

First to sixth front interlayer insulating films 110, 210, 220, 230, 240, and 250 may be formed on the first surface 100a of the substrate 100. The first to sixth front interlayer insulating films 110, 210, 220, 230, 240, and 250 may be sequentially stacked on the first surface 100a of the substrate 100. The first to sixth front interlayer insulating films 110, 210, 220, 230, 240 and 250 may include, e.g., at least one of silicon oxide, silicon oxynitride and a low dielectric constant (low-k) material having a lower dielectric constant than silicon oxide.

The first front interlayer insulating film 110 and the second front interlayer insulating film 210 may be formed to cover the field insulating film 105, the first source/drain region 160, the second source/drain region 260, the gate spacer 140, and the gate capping pattern 150. For example, the first front interlayer insulating film 110 may be formed on the field insulating film 105 to cover the side wall of the gate spacer 140. The second front interlayer insulating film 210 may be formed on the first front interlayer insulating film 110 to cover the upper surface of the gate capping pattern 150.

The first source/drain contacts 180 may be placed on both sides of, e.g., each of, the gate electrodes G1 to G3. The first source/drain contact 180 may be electrically connected to the first active region AR1. The first source/drain contact 180 may be placed on the first source/drain region 160 of the first active pattern F1. The first source/drain contact 180 penetrates the first front interlayer insulating film 110 and the second front interlayer insulating film 210, and may be electrically connected to the first source/drain region 160. A first silicide film 165 may be formed between the first source/drain contact 180 and the first source/drain region 160.

In some embodiments, the first source/drain contact 180 may include a first portion 180a connected to the first source/drain region 160, and a second portion 180b extending from the first portion 180a in the second direction, e.g., in the Y-direction. The first portion 180a may, e.g., directly, contact the first source/drain region 160 (or the first silicide film 165 on the first source/drain region 160). The second portion 180b may, e.g., directly, contact the first landing pad 530, which will be described later.

The second source/drain contacts 280 may be placed on both sides of, e.g., each of, the gate electrodes G1 to G3. The second source/drain contact 280 may be electrically connected to the second active region AR2. The second source/drain contact 280 may be placed on the second source/drain region 260 of the second active pattern F2. The second source/drain contact 280 penetrates the first front interlayer insulating film 110 and the second front interlayer insulating film 210, and may be electrically connected to the second source/drain region 260. A second silicide film 265 may be formed between the second source/drain contact 280 and the second source/drain region 260.

In some embodiments, the second source/drain contact 280 may include a first portion 280a connected to the second source/drain region 260, and a second portion 280b extending from the first portion 280a in the second direction, e.g., in the Y-direction. The first portion 280a may, e.g., directly, contact the second source/drain region 260 (or the second silicide film 265 on the second source/drain region 260). The second portion 280b may, e.g., directly, contact the second landing pad 630, which will be described later.

The first source/drain contact 180 may include a first source/drain barrier film 182 and a first source/drain filling film 184. The second source/drain contact 280 may include a second source/drain barrier film 282 and a second source/drain filling film 284. The first and second source/drain barrier films 182 and 282 may be interposed between the first and second front interlayer insulating films 110 and 210 and a corresponding one of the first and second source/drain filling films 184 and 284.

The gate contact 190 may be placed, e.g., on the second gate electrode G2 (FIGS. 1 and 4). The gate contact 190 penetrates the gate capping pattern 150, and may be connected, e.g., directly, to the gate conductive film 130. The gate contact 190 may also be placed on, e.g., and connected to, the first gate electrode G1 and the third gate electrode G3.

The gate contact 190 may include a gate barrier film 192 and a gate filling film 194. The gate barrier film 192 may be interposed between the gate filling film 194 and each of the gate capping pattern 150, the second front interlayer insulating film 210, and the third front interlayer insulating film 220.

For example, each of the first source/drain barrier film 182, the second source/drain barrier film 282, and the gate barrier film 192 may include at least one of titanium (Ti), tantalum (Ta), tungsten (W), nickel (Ni), cobalt (Co), platinum (Pt), alloys thereof and nitrides thereof. For example, each of the first source/drain filling film 284, the second source/drain filling film 184, and the gate filling film 194 may include at least one of aluminum (Al), copper (Cu), tungsten (W), molybdenum (Mo), cobalt (Co) and alloys thereof.

The first front via 222 may be provided inside the third front interlayer insulating film 220. The first front via 222 may be placed at, e.g., on, the first and second source/drain contacts 180 and 280. The first front via 222 may be connected to the first and second source/drain contacts 180 and 280. The first front wiring 232 may be provided inside the fourth front interlayer insulating film 230. The first front wiring 232 may be connected to the first front via 222. The second front via 242 may be provided inside the fifth front interlayer insulating film 240. The second front via 242 may be connected to the first front wiring 232. The second front wiring 252 may be provided inside the sixth front interlayer insulating film 250. The second front wiring 252 may be connected to the second front via 242.

Each of the first and second front vias 222 and 242, and the first and second front wirings 232 and 252 may include a front barrier film 202 and a front filling film 204. The front barrier film 202 may be interposed between the front filling film 204 and each of the third to sixth front interlayer insulating films 220, 230, 240 and 250.

First to fifth back interlayer insulating films 310, 320, 330, 340, and 350 may be formed on the second surface 100b of the substrate 100. The first to fifth back interlayer insulating films 310, 320, 330, 340, and 350 may be sequentially stacked on the second surface 100b of the substrate 100. The first to fifth back interlayer insulating films 310, 320, 330, 340, and 350 may include, e.g., at least one of silicon oxide, silicon oxynitride, and a low dielectric constant (low-k) material having a lower dielectric constant than silicon oxide.

The first power rail 312 and the second power rail 314 may be provided inside the first back interlayer insulating film 310. The first power rail 312 and the second power rail 314 may be placed on the second surface 100b of the substrate 100, e.g., the substrate 100 may be between the first front interlayer insulating film 110 and each of the first and second power rails 312 and 314.

The first power rail 312 and the second power rail 314 may extend, e.g., lengthwise, in the first direction, e.g., the first and second power rails 312 and 314 may extend continuously along the X-direction to overlap at least a majority of the substrate 100. The first power rail 312 may be spaced apart from the second power rail 314 in the second direction, e.g., in the Y-direction. The first power rail 312 may provide a first voltage $V_{DD}$. The second power rail 314 may provide a second voltage $V_{SS}$. For example, the first power rail 312 may provide the power supply voltage $V_{DD}$, and the second power rail 314 may provide a ground voltage $V_{SS}$.

Figure 8:
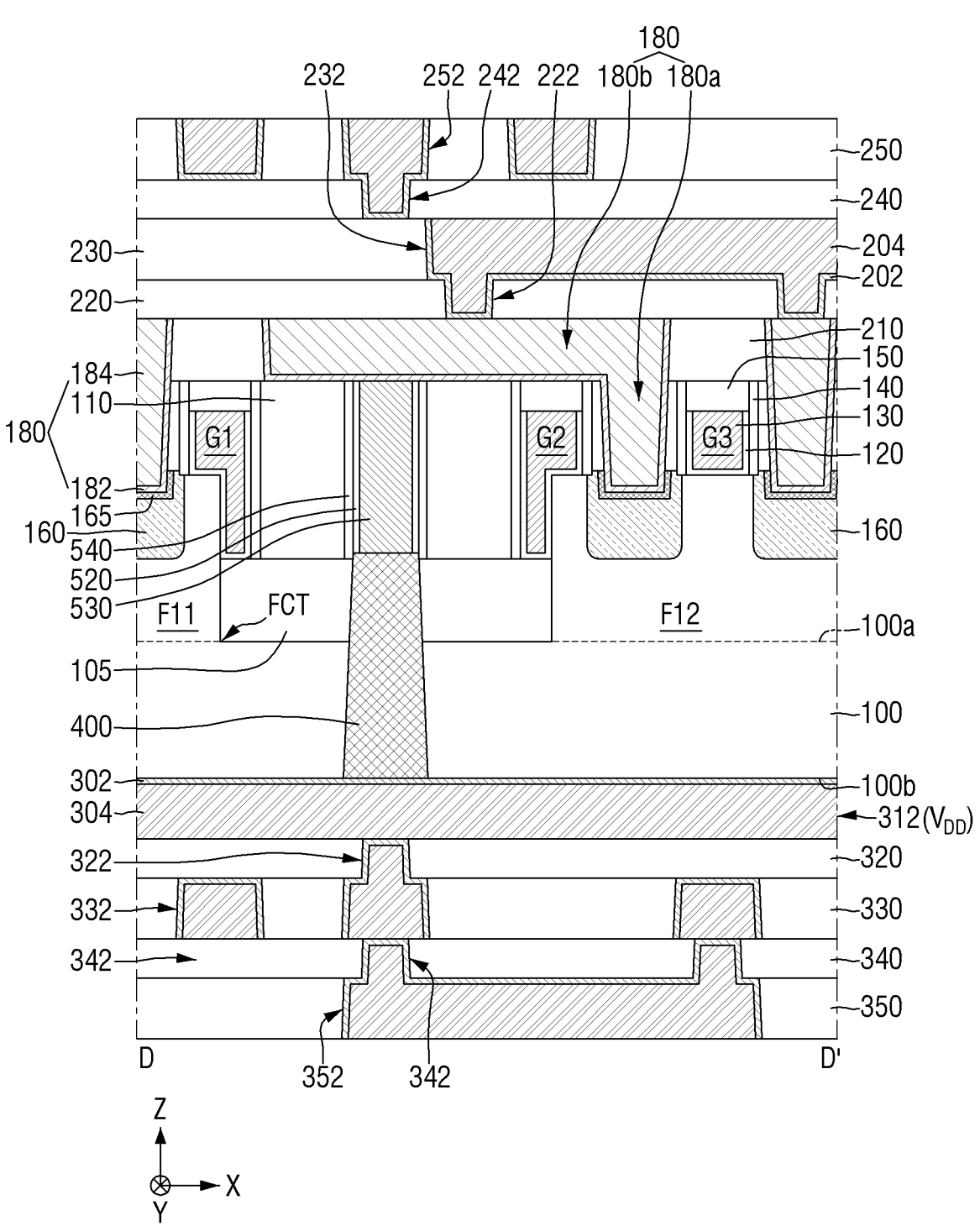
FIG. 8 is a cross-sectional view taken along line D-D' of FIG. 7.

At least a part of the first power rail 312 may overlap the first landing pad 530 in a third direction, e.g., a vertical direction extending in the Z-direction. The third direction, e.g., the Z-direction, may be a direction that is perpendicular to the first surface 100a of the substrate 100. At least a part of the second power rail 314 may overlap the second landing pad 630 in the third direction, e.g., in the Z-direction. For example, as illustrated in FIG. 3, the first and second power rails 312 and 314 may not overlap the first and second active patterns F1 and F2 in the third direction, e.g., in the Z-direction. In another example, as illustrated in FIG. 8, the first and second power rails 312 and 314 may overlap at least a part of the active patterns in the third direction.

For example, if the first power rail 312 and the second power rail 314 were to be formed on the first surface 100a of the substrate 100 or inside the field insulating film 105, the first and second power rails 312 and 314 could potentially be contaminated during the process of forming the first source/drain region 160 or the like on the first surface 100a of the substrate 100. In contrast, in the semiconductor device according to some embodiments, since the first and second power rails 312 and 314 are formed on the second surface 100b of the substrate 100, the risk of contamination of the first and second power rails 312 and 314 is substantially decreased. Further, since the process of forming the first and second power rails 312 and 314 is performed separately from the process of forming the first source/drain region 160 or the like on the first surface 100a of the substrate 100, the process may be further simplified.

A first back via 322 may be provided inside the second back interlayer insulating film 320. The first back via 322 may be placed on the first and second power rails 312 and 314, e.g., so the first and second power rails 312 and 314 may be between the substrate 100 and corresponding ones of the first back vias 322. The first back via 322 may be connected to the first and second power rails 312 and 314. A first back wiring 332 may be provided in the third back interlayer insulating film 330. The first back wiring 332 may be connected to the first back via 322. A second back via 342 may be provided inside the fourth back interlayer insulating film 340. The second back via 342 may be connected to the first back wiring 332. A second back wiring 352 may be provided inside a fifth back interlayer insulating film 350. The second back wiring 352 may be connected to the second back via 342.

The first and second power rails 312 and 314, the first and second back vias 322 and 342, and the first and second back wirings 332 and 352 may be relatively greater than the first and second front vias 222 and 242 and the first and second front wirings 232 and 252.

Each of the first and second power rails 312 and 314, the first and second back vias 322 and 342, and the first and second back wirings 332 and 352 may include a back barrier film 302 and a back filling film 304. The back barrier film 302 may be interposed between the back filling film 304 and each of the first to fifth back interlayer insulating films 310, 320, 330, 340, and 350.

For example, the first and second front vias 222 and 242, the first and second front wirings 232 and 252, the first and second power rails 312 and 314, the first and second back vias 322 and 342, and first and second back wirings 332 and 352 may be formed by a dual damascene process. In another example, the first and second front vias 222 and 242, the first and second front wirings 232 and 252, the first and second power rails 312 and 314, the first and second back vias 322 and 342, and first and second back wirings 332 and 352 may be formed by a single damascene processes or other wiring processes.

The first and second back vias 322 and 342, and the first and second back wirings 332 and 352 may form a power delivery network (PDN) of the semiconductor device according to some embodiments. For example, the first and second back vias 322 and 342, and the first and second back wirings 332 and 352 may be connected to a pad or the like of a semiconductor device according to some embodiments, and may be supplied with power from the outside and transfer the power. Therefore, since the semiconductor device according to some embodiments includes the first and second power rails 312 and 314 formed on the second surface 100b of the substrate 100, the power delivery network and PPA (Power, Performance, Area) can be improved or enhanced, e.g., as compared to a semiconductor device in which power rails and/or a power delivery network is formed on the first surface 100a of the substrate 100. The arrangement and number of the first and second front vias 222 and 242, the first and second front wirings 232 and 252, the first and second back vias 322 and 342, and the first and second back wirings 332 and 352 may be adjusted, in accordance with design requirements.

For example, the front barrier film 202 and the back barrier film 302 may include at least one of titanium (Ti), tantalum (Ta), tungsten (W), nickel (Ni), cobalt (Co), platinum (Pt), alloys thereof and nitrides thereof. For example, the front filling film 204 and the back filling film 304 may include at least one of aluminum (Al), copper (Cu), tungsten (W), molybdenum (Mo), cobalt (Co) and alloys thereof.

The first and second landing pads 530 and 630 may be placed on portions of the substrate 100 in which the first and second active patterns F1 and F2 are not placed. The first and second landing pads 530 and 630 may be placed on the field insulating film 105, e.g., to avoid vertical overlap with the first and second active patterns F1 and F2. For example, the first and second landing pads 530 and 630 may be placed in the region in which dummy fins are removed. Therefore, the semiconductor devices according to some embodiments may improve or enhance PPA (Power, Performance, Area).

In some embodiments, the first and second landing pads 530 and 630 may be placed between two gate electrodes adjacent to each other among the gate electrodes G1 to G3 arranged at regular intervals. The first landing pad 530 and the second landing pad 630 may be placed between the same adjacent gate electrodes, e.g., the first landing pad 530 and the second landing pad 630 may be aligned along the Y-direction (FIG. 1). For example, the first landing pad 530 may be placed between the first gate electrode G1 and the second gate electrode G2, and the second landing pad 630 may be placed between the first gate electrode G1 and the second gate electrode G2. The first landing pad 530 may overlap the first power rail 312 in the third direction Z. The second landing pad 630 is placed between the first gate electrode G1 and the second gate electrode G2, and may overlap the second power rail 314 in the third direction Z.

For example, a width W11 of the first landing pad 530 in the first direction and a width W12 of the second landing pad 630 in the first direction, e.g., in the X-direction, may be substantially the same as a width W13 of the gate electrodes G1 to G3 in the first direction, e.g., in the X-direction. For example, as illustrated in FIG. 3, the width of each of the first landing pad 530 and the second landing pad 630 in the second direction, e.g., in the Y-direction, may be larger than the width of the first and second power rails 312 and 314 in the second direction, e.g., the Y-direction, respectively.

The first and second landing pads 530 and 630 may penetrate the first front interlayer insulating film 110. The first landing pad 530 may connect the first source/drain contact 180 and the first through via 400. The first landing pad 530 may come into contact with the second portion 180b of the first source/drain contact 180 and the first through via 400. The second landing pad 630 may connect the second source/drain contact 280 and the second through via 500. The second landing pad 630 may come into contact with the second portion 280b of the second source/drain contact 280 and the second through via 500.

The first and second landing pads 530 and 630 may be formed by the process of forming the gate electrodes G1 to G3. The upper surfaces of the first and second landing pads 530 and 630 may be placed on the same plane as the upper surface of the gate capping pattern 150, e.g., the upper surfaces of the first and second landing pads 530 and 630 may be coplanar with the upper surface of the gate capping pattern 150. A first spacer 540 may be placed on opposite, e.g., both, side walls of the first landing pad 530, and a second spacer 640 may be placed on opposite, e.g., both, side walls of the second landing pad 630. The first spacer 540 and the second spacer 640 may be placed on an uppermost surface 105US of the field insulating film 105.

In some embodiments, a first dielectric film 520 may be placed between the first landing pad 530 and the first spacer 540. The first dielectric film 520 may be formed along both side walls of the first landing pad 530. A second dielectric film 620 may be placed between the second landing pad 630 and the second spacer 640. The second dielectric film 620 may be formed along both side walls of the second landing pad 630.

The first and second landing pads 530 and 630 may include the same material as that of the gate conductive film 130. The first and second spacers 540 and 640 may include the same material as that of the gate spacer 140. The first and second dielectric films 520 and 620 may include the same material as that of the gate dielectric film 120.

In a semiconductor device according to some embodiments, the first and second through vias 400 and 500 and the first and second source/drain contacts 180 and 280 are connected by the first and second landing pads 530 and 630. Therefore, there is no need for a separate process for forming power vias for connecting the first and second through vias 400 and 500 and the first and second source/drain contacts 180 and 280. Further, since the first and second landing pads 530 and 630 are formed by the same process as the gate electrodes G1 to G3, there is no need for a separate process for forming the first and second landing pads 530 and 630. Therefore, the manufacturing process may be further simplified.

The first and second through vias 400 and 500 may penetrate the substrate 100 and the field insulating film 105. The first through via 400 may penetrate the substrate 100 and the field insulating film 105 to connect the first power rail 312 and the first landing pad 530. The second through via 500 may penetrate the substrate 100 and the field insulating film 105 to connect the second power rail 314 and the second landing pad 630. Therefore, the first source/drain region 160 may receive the first voltage $V_{DD}$ from the first power rail 312 through the first through via 400, the first landing pad 530, and the first source/drain contact 180. The second source/drain region 260 may receive the second voltage Vss from the second power rail 314 through the second through via 500, the second landing pad 630, and the second source/drain contact 280.

In some embodiments, an upper surface 400US of the first through via 400 and an upper surface 500US of the second through via 500 may be placed above the uppermost surface 105US of the field insulating film 105, e.g., relative to the second surface 100b of the substrate 100.

In some embodiments, the width of the first through via 400 may decrease from the first power rail 312 toward the first landing pad 530. The width of the second through via 500 may decrease from the second power rail 314 toward the second landing pad 630. This may be due to the characteristics of the etching process for forming the first and second through vias 400 and 500. For example, the first and second through vias 400 and 500 may be formed by an etching process performed on the second surface 100b of the substrate 100.

Figure 5:
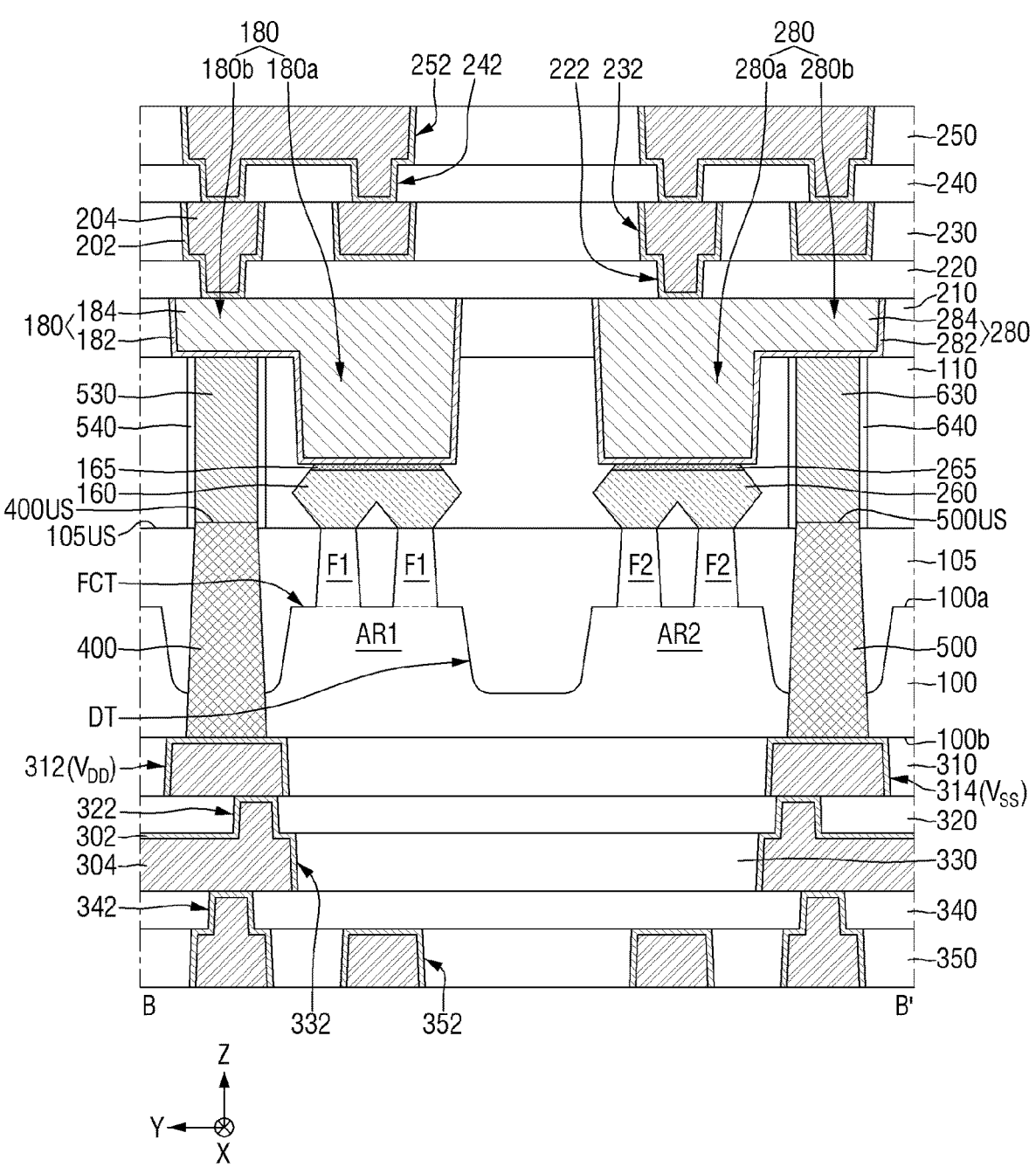
FIG. 5 is a cross-sectional view taken along line B-B' of FIG. 1.

FIG. 5 is a cross-sectional view along line B-B' of FIG. 1. For convenience of explanation, differences with respect to FIGS. 1 to 4 will be mainly described.

Referring to FIG. 5, in a semiconductor device according to some embodiments, the first spacer 540 may be formed, e.g., directly, on both side walls of the first landing pad 530, and the second spacer 640 may be formed, e.g., directly, on both side walls of the second landing pad 630. That is, the first dielectric film 520 of FIG. 3 may not be formed between the first landing pad 530 and the first spacer 540, and the second dielectric film 620 of FIG. 3 may not be formed between the second landing pad 630 and the second spacer 640.

Figure 6:
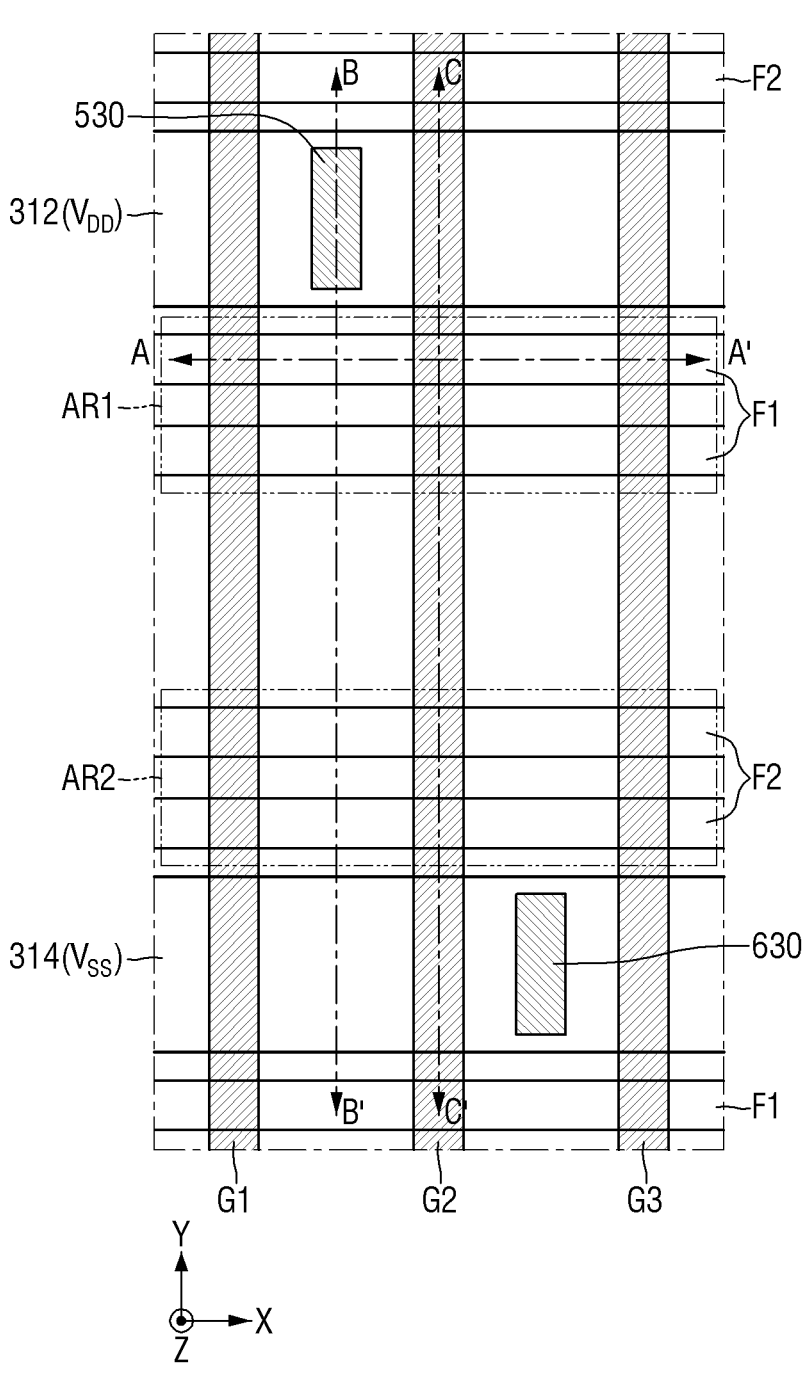
FIG. 6 is a schematic layout diagram of a semiconductor device according to some embodiments.

FIG. 6 is a schematic layout diagram of a semiconductor device according to some embodiments. For convenience of explanation, differences with respect to FIGS. 1 to 4 will be mainly described.

Referring to FIG. 6, in a semiconductor device according to some embodiments, the first landing pad 530 and the second landing pad 630 may be placed between different gate electrodes from each other, e.g., between different pairs of gate electrodes. For example, the first landing pad 530 may be placed between the first gate electrode G1 and the second gate electrode G2, and the second landing pad 630 may be placed between the second gate electrode G2 and the third gate electrode G3.

Figure 7:
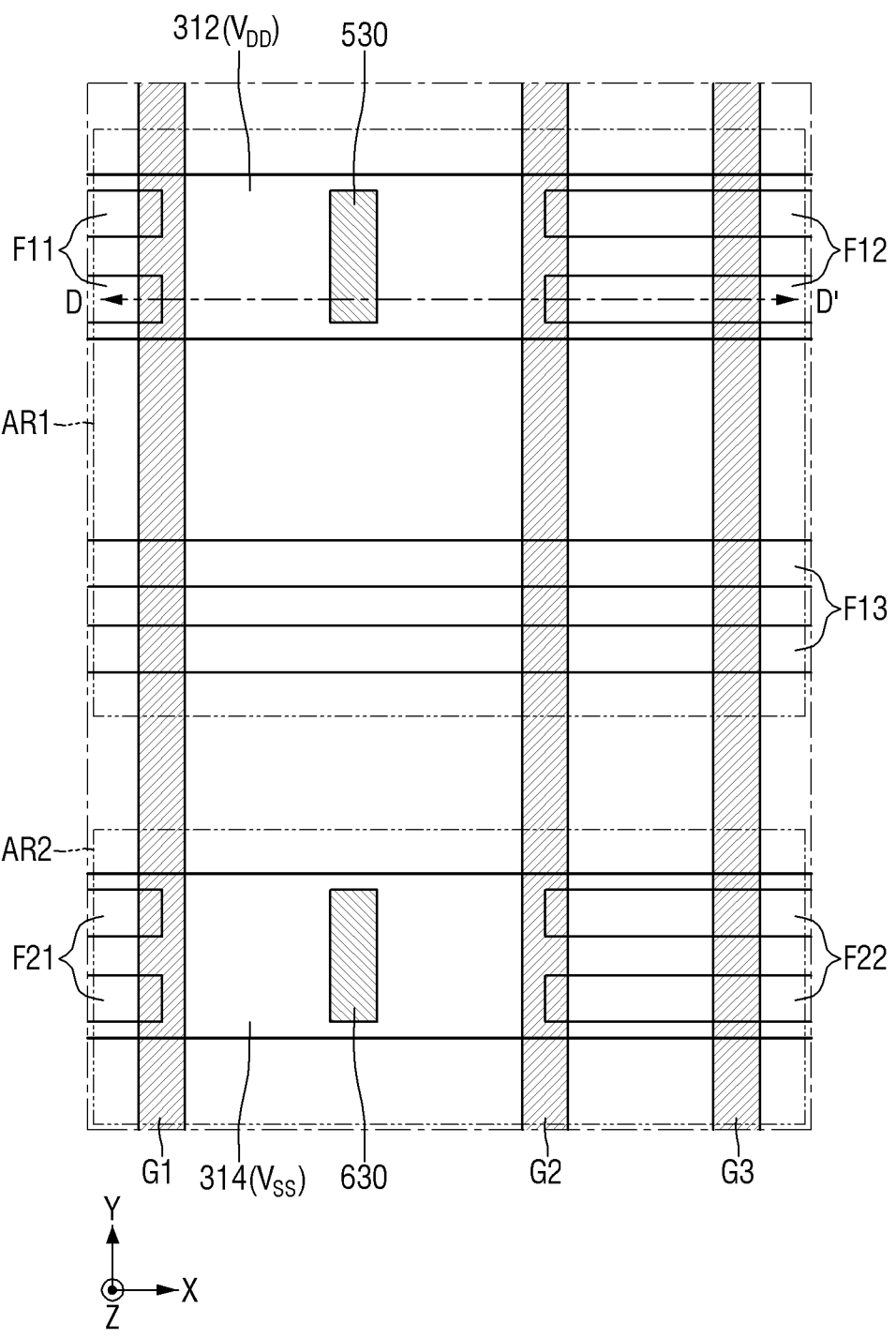
FIG. 7 is a schematic layout diagram of a semiconductor device according to some embodiments.

FIG. 7 is a schematic layout diagram of a semiconductor device according to some embodiments. FIG. 8 is a cross-sectional view taken along line D-D' of FIG. 7. For convenience of explanation, differences with respect to FIGS. 1 to 4 will be mainly described.

Referring to FIGS. 7 and 8, in a semiconductor device according to some embodiments, the first active region AR1 may include first active patterns F11, F12, and F13, and the second active region AR2 may include second active patterns F21 and F22.

For example, as illustrated in FIG. 7, a first-first active pattern F11 may be spaced apart from a first-second active pattern F12 in the first direction, e.g., in the X-direction. The first-first active pattern F11 and the first-second active pattern F12 may be separated by a fin cut trench FCT. An end side wall of the first-first active pattern F11 and an end side wall of the first-second active pattern F12 may be opposite to each other in the first direction, e.g., in the X-direction. A first-third active pattern F13 may be spaced apart from the first-first and first-second active patterns F11 and F12 in the second direction, e.g., in the Y-direction.

A second-first active pattern F21 may be spaced apart from a second-second active pattern F22 in the first direction, e.g., in the X-direction. The second-first active pattern F21 and the second-second active pattern F22 may be separated by the fin cut trench FCT. An end side wall of the second-first active pattern F21 and an end side wall of the second-second active pattern F22 may be opposite to each other in the first direction e.g., in the X-direction. The second-first and second-second active patterns F21 and F22 may be spaced apart from the first-third active pattern F13 in the second direction, e.g., in the Y-direction.

The first gate electrode G1 may be formed on the first-first active pattern F11, the first-third active pattern F13, and the second-first active pattern F21. The first gate electrode G1 may be placed at an end including the end side wall of the first-first active pattern F11 and an end including the end side wall of the second-first active pattern F21. The first gate electrode G1 may wrap, e.g., around, the end of the first-first active pattern F11 and the end of the second-first active pattern F21. The second gate electrode G2 may be formed on the first-second active pattern F12, the first-third active pattern F13, and the second-second active pattern F22. The second gate electrode G2 may be placed at an end including the end side wall of the first-second active pattern F12 and an end including the end side wall of the second-second active pattern F22. The second gate electrode G2 may wrap, e.g., around, the end of the first-second active pattern F12 and the end of the second-second active pattern F22. The third gate electrode G3 may be formed on the first-second active pattern F12, the first-third active pattern F13, and the second-second active pattern F22.

A source/drain region is not placed on one side or both sides of the first gate electrode G1 at a point on which the first-first active pattern F11 and the second-first active pattern F21 intersects the first gate electrode G1. At a point on which the first first-first active pattern F11 and the second-first active pattern F21 intersects the first gate electrode G1, a part of the first gate electrode G1 is formed on the first-first active pattern F11 and the second-first active pattern F21, and the remaining part of the first gate electrode G1 may be formed on the field insulating film 105. The source/drain region is not placed on one side or both sides of the second gate electrode G2 at a point on which the first-second active pattern F12 and the second-second active pattern F22 intersects the second gate electrode G2. At a point on which the first-second active pattern F12 and the second-second active pattern F22 intersects the second gate electrode G2, a part of the second gate electrode G2 is formed on the first-second active pattern F12 and the second-second active pattern F22, and the remaining part of the second gate electrode G2 may be formed on the field insulating film 105.

The first and second power rails 312 and 314 may overlap, e.g., at least a part of the active patterns F11, F12, F13, and F22, which are spaced apart from each other in the first direction (e.g., in the X-direction), in the third direction (e.g., in the Z-direction). For example, the first power rail 312 may overlap the first-first and first-second active patterns F11 and F12 in the third direction, and the second power rail 314 may overlap the second-first and second-second active patterns F21 and F22 in the third direction.

In some embodiments, the first and second landing pads 530 and 630 may be placed in regions in which the first and second active patterns F11, F12, F13, and F22 are cut. The first and second landing pads 530 and 630 may be placed between the first and second active patterns F11, F12, F21, and F22 separated from each other in the first direction, e.g., in the X-direction. That is, the first and second landing pads 530 and 630 may be placed between the first and second active patterns F11, F12, F21 and F22 whose end side walls are opposite to each other. The first and second landing pads 530 and 630 may be placed on the field insulating film 105.

For example, the first landing pad 530 may be placed between the first-first active pattern F11 and the first-second active pattern F12. The first landing pad 530 may be placed between the end side wall of the first-first active pattern F11 and the end side wall of the first-second active pattern F12. The second landing pad 630 may be placed between the second-first active pattern F21 and the second-second active pattern F22. The second landing pad 630 may be placed between the end side wall of the second-first active pattern F21 and the end side wall of the second-second active pattern F22.

In some embodiments, an interval between the first gate electrode G1 and the second gate electrode G2 may be greater than an interval between the second gate electrode G2 and the third gate electrode G3. The first gate electrode G1 and the second gate electrode G2 may be spaced apart from each other so that one gate electrode is further placed between them. The first and second landing pads 530 and 630 may be placed between the first gate electrode G1 and the second gate electrode G2.

For example, an interval between the first gate electrode G1 and the first landing pad 530 or the second landing pad 630 may be equal to an interval between the second gate electrode G2 and the first landing pad 530 or the second landing pad 630, and an interval between the second gate electrode G2 and the third gate electrode G3. That is, the first and second landing pads 530 and 630 may be placed at positions corresponding to the omitted gate electrodes between the first gate electrode G1 and the second gate electrode G2.

The first and second landing pads 530 and 630 are only placed between the first gate electrode G1 and the second gate electrode G2, and the distance between the first and second landing pads 530 and 630 and the first gate electrode G1 does not need to be equal to the distance between the first and second landing pads 530 and 630 and the second gate electrode G2. In addition, a gate electrode that crosses the first-third active pattern F13 may be further placed between the first gate electrode G1 and the second gate electrode G2 and between the first landing pad 530 and the second landing pad 630. The first gate electrode G1, the gate electrode that crosses the first-third active patterns F13, and the second gate electrode G2 may be arranged along the first direction, e.g., the X-direction, at regular intervals.

Figure 9:
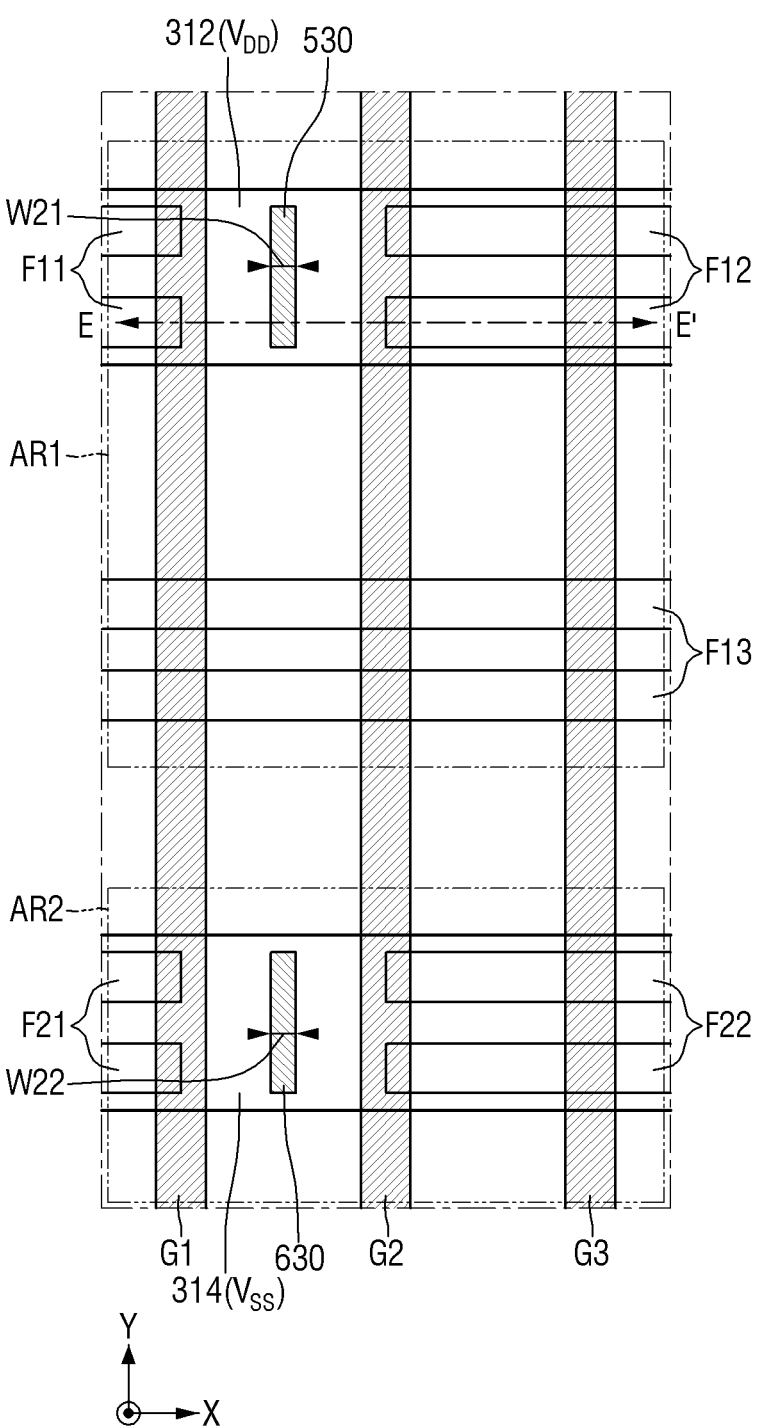
FIG. 9 is a schematic layout diagram of a semiconductor device according to some embodiments.
Figure 10:
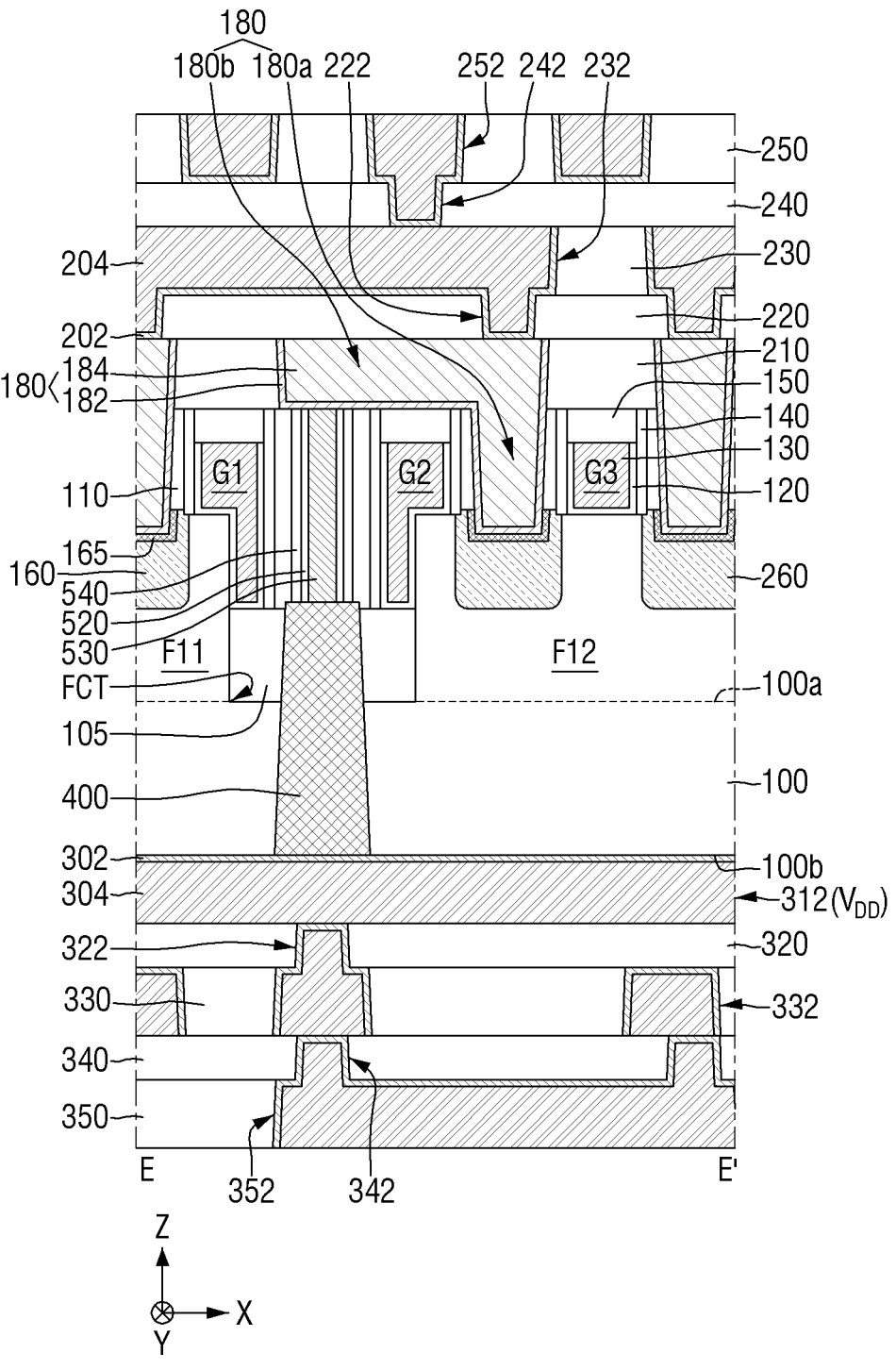
FIG. 10 is a cross-sectional view taken along line E-E' of FIG. 9.

FIG. 9 is a schematic layout diagram of a semiconductor device according to some embodiments. FIG. 10 is a cross-sectional view taken along line E-E' of FIG. 9. For convenience of explanation, differences with respect to FIGS. 7 and 8 will be mainly described.

Referring to FIGS. 9 and 10, in a semiconductor device according to some embodiments, the gate electrodes G1 to G3 may be arranged in the first direction at regular intervals. The first gate electrode G1 may be formed on the first-first active pattern F11, the first-third active pattern F13, and the second-first active pattern F21. The second gate electrode G2 may be formed on the first-second active pattern F12, the first-third active pattern F13, and the second-second active pattern F22. The third gate electrode G3 may be formed on the first-second active pattern F12, the first-third active pattern F13, and the second-second active pattern F22.

The first and second landing pads 530 and 630 may be placed in the region in which the first and second active patterns F11, F12, F13 and F22 between the adjacent gate electrodes G1 and G3 are cut. Therefore, the semiconductor device according to some embodiments may improve or enhance PPA (Power, Performance, Area). For example, the first landing pad 530 may be placed between the first-first active pattern F11 and the first-second active pattern F12 between the first gate electrode G1 and the second gate electrode G2. The second landing pad 630 may be placed between the second-first active pattern F21 and the second-second active pattern F22 between the first gate electrode G1 and the second gate electrode G2.

For example, a width W21 of the first landing pad 530 in the first direction and a width W22 of the second landing pad 630 in the first direction may be smaller than a width W23 of the gate electrodes G1 to G3 in the first direction.

Figure 11:
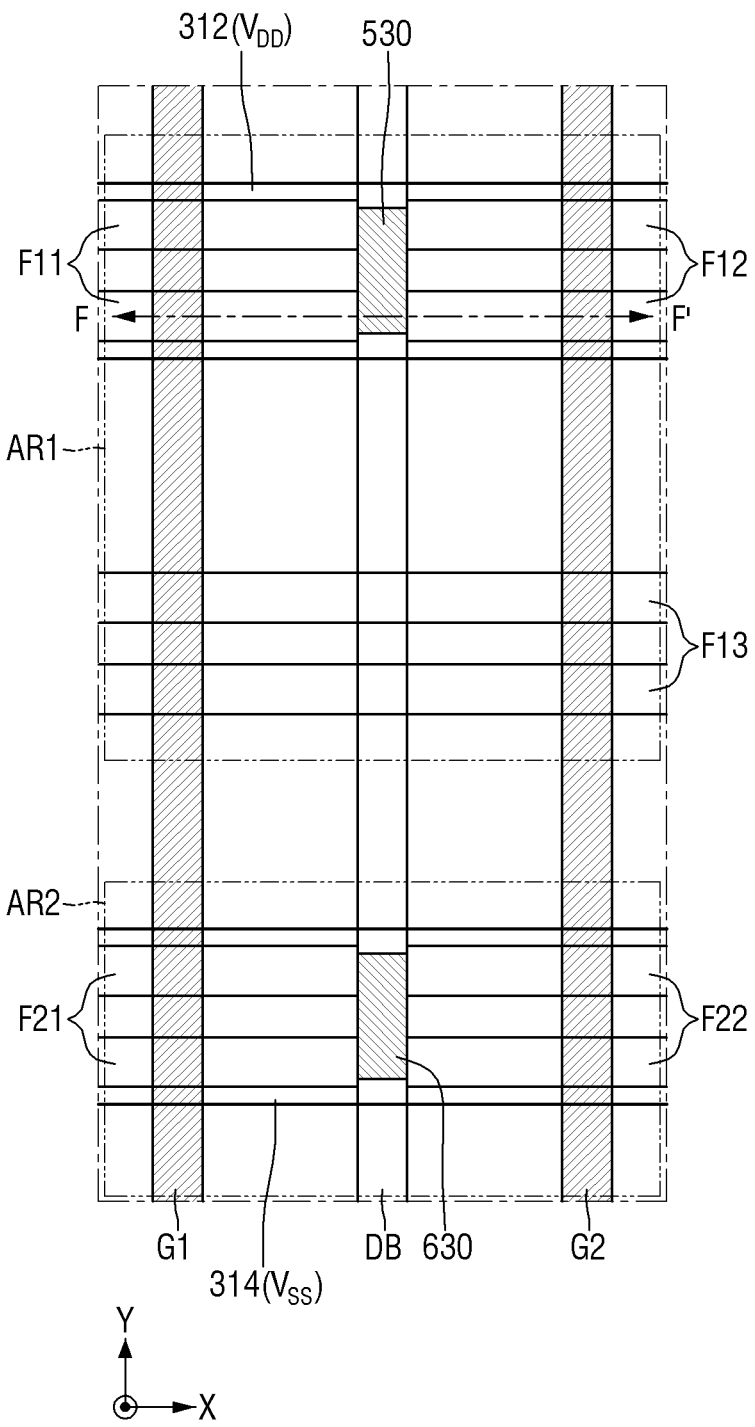
FIG. 11 is a schematic layout diagram of a semiconductor device according to some embodiments.
Figure 12:
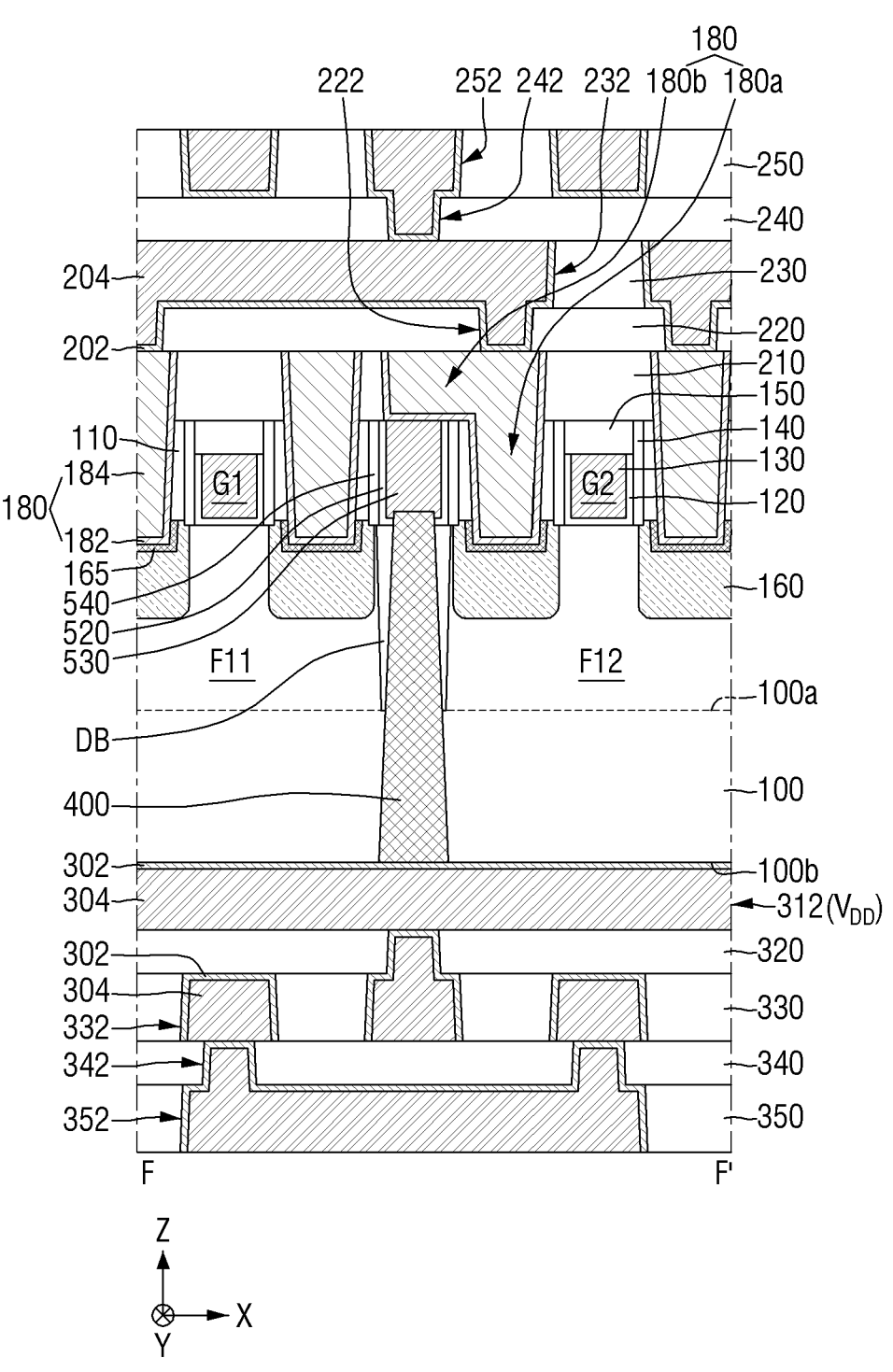
FIG. 12 is a cross-sectional view taken along line F-F' of FIG. 11.

FIG. 11 is a schematic layout diagram of a semiconductor device according to some embodiments. FIG. 12 is a cross-sectional view taken along line F-F' of FIG. 11. For convenience of explanation, differences with respect to FIGS. 1 to 4 will be mainly described.

Referring to FIGS. 11 and 12, in a semiconductor device according to some embodiments, the first active region AR1 may include the first active patterns F11, F12, and F13, and the second active region AR2 may include the second active patterns F21 and F22.

The first-first active pattern F11 may be spaced apart from the first-second active pattern F12 in the first direction. The first-first active pattern F11 and the first-second active pattern F12 may be separated by an element separation structure DB. An end side wall of the first-first active pattern F11 and an end side wall of the first-second active pattern F12 may be opposite to each other in the first direction. The first-third active pattern F13 may be spaced apart from the first-first and first-second active patterns F11 and F12 in the second direction. The second-first active pattern F21 may be spaced apart from the second-second active pattern F22 in the first direction. The second-first active pattern F21 and the second-second active pattern F22 may be separated by the element separation structure DB. The end side wall of the second-first active pattern F21 and the end side wall of the second-second active pattern F22 may be opposite to each other in the first direction. The second-first and second-second active patterns F21 and F22 may be spaced apart from the first-third active pattern F13 in the second direction.

The element separation structure DB may be placed between the first source/drain region 160 and the second source/drain region 260 adjacent to each other in the first direction. The element separation structure DB may extend in the second direction. The element separation structure DB may include, e.g., at least one of silicon nitride, silicon oxide, silicon carbide, silicon carbonitride, silicon oxycarbide, silicon oxynitride, silicon oxycarbonitride and aluminum oxide. The element separation structure DB may be made up of a plurality of films.

The first gate electrode G1 may be formed on the first-fist active pattern F11, the first-third active pattern F13, and the second-first active pattern F21. The second gate electrode G2 may be formed on the first-second active pattern F12, the first-third active pattern F13, and the second-second active pattern F22.

In some embodiments, the first and second landing pads 530 and 630 may be placed in regions in which the first and second active patterns F11, F12, F13, and F22 are cut. The first and second landing pads 530 and 630 may be placed between the first and second active patterns F11, F12, F21, and F22 separated from each other in the first direction. That is, the first and second landing pads 530 and 630 may be placed between the first and second active patterns F11, F12, F21 and F22 whose end side walls are opposite to each other. The first and second landing pads 530 and 630 may be placed on the element separation structure DB.

In some embodiments, the first through via 400 may be formed on the element separation structure DB. The first through via 400 may penetrate the substrate 100 and the element separation structure DB. The first through via 400 may connect the first power rail 312 and the first landing pad 530. The second through via may be formed on the element separation structure DB. The second through via may penetrate the substrate 100 and the element separation structure DB to connect the second power rail 314 and the second landing pad 630.

In some embodiments, the first-first active pattern F11 and the first-second active pattern F12 included in the first active region AR1 may be separated by the fin cut trench FCT as shown in FIG. 7 or 9, and the second active region AR2 may be separated by the element separation structure DB as shown in FIG. 11. In this case, the first landing pad 530 may be placed on the field insulating film 105 as shown in FIG. 7 or 9, and the second landing pad 630 may be placed on the element separation structure DB.

Figure 13:
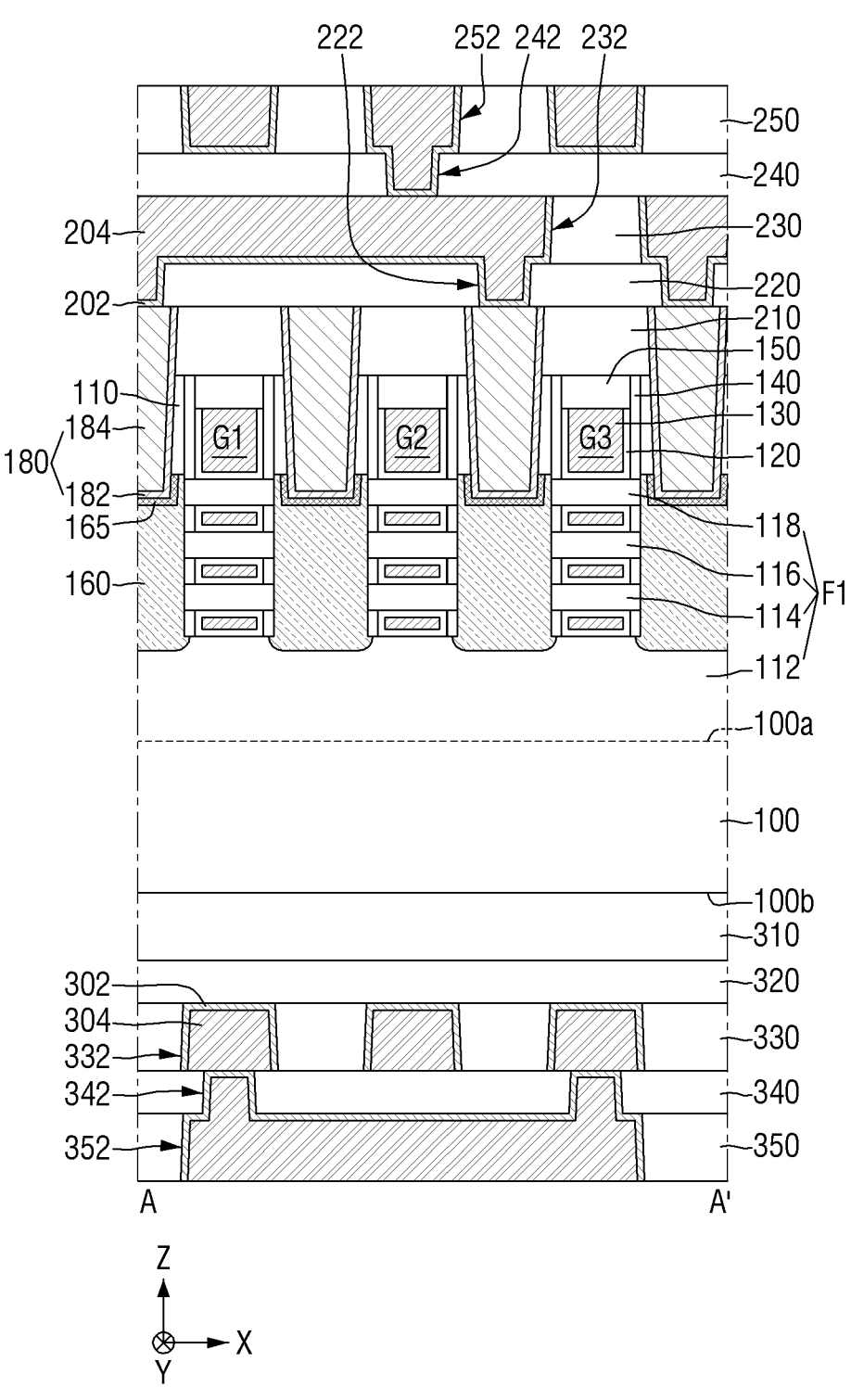
FIG. 13 is a cross-sectional view taken along line A-A' of FIG. 1.
Figure 14:
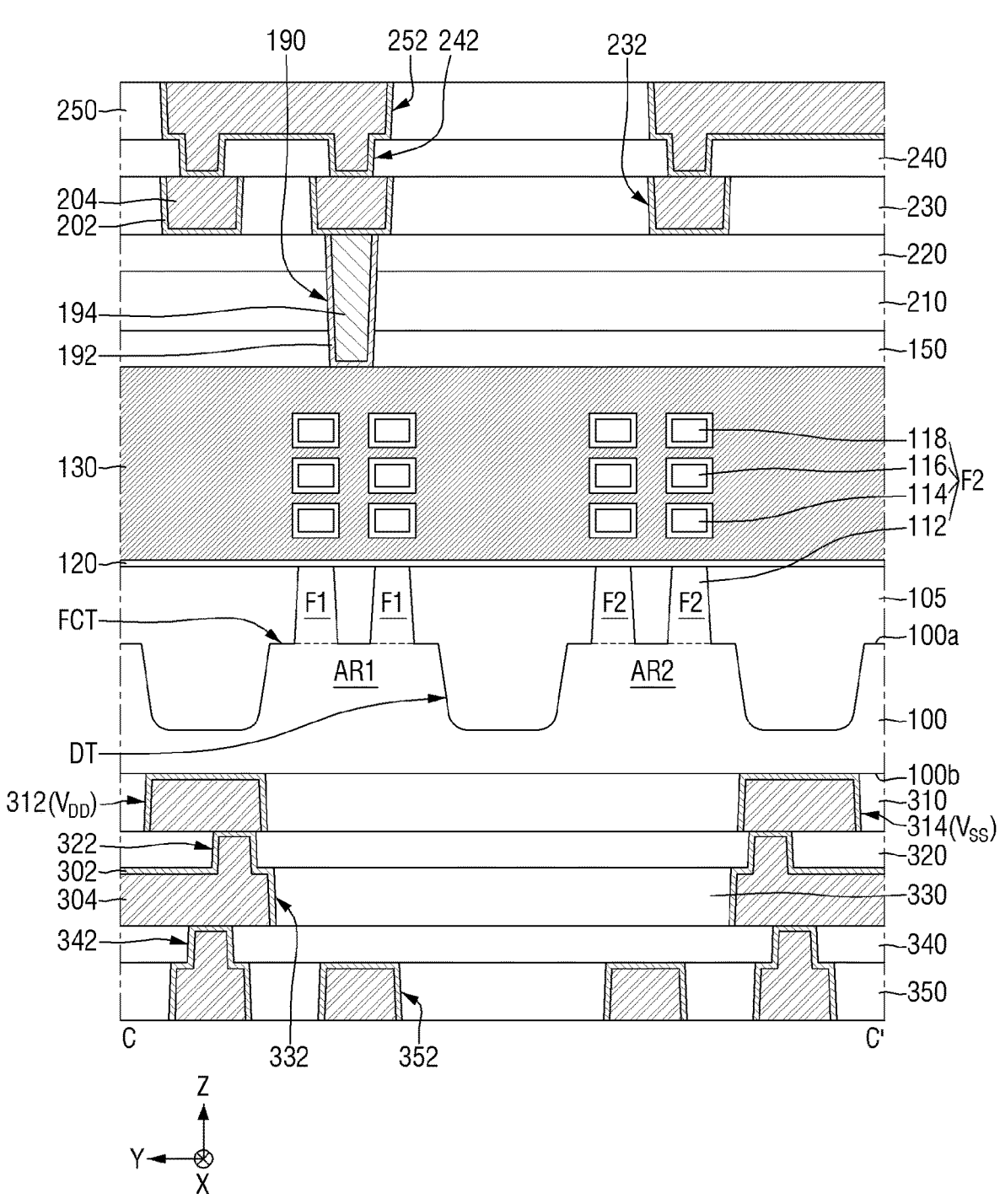
FIG. 14 is a cross-sectional view taken along line C-C' of FIG. 1.

FIG. 13 is a cross-sectional view taken along line A-A' of FIG. 1. FIG. 14 is a cross-sectional view taken along line C-C' of FIG. 1. For convenience of explanation, differences with respect to FIGS. 1 to 4 will be mainly described.

Referring to FIGS. 13 and 14, in a semiconductor device according to some embodiments, the first and second active patterns F1 and F2 may include a fin-shaped pattern 112 protruding from the first surface 100a of the substrate 100, and a plurality of wire patterns 114, 116, and 118. The first and second active patterns F1 and F2 may extend in the first direction.

For example, the plurality of wire patterns 114, 116, and 118 may be sequentially stacked on the first surface 100a of the substrate 100 and may be separated from each other in the third direction, e.g., in the Z-direction. A first wire pattern 114 may be spaced apart from the fin-shaped pattern 112 in the third direction, a second wire pattern 116 may be spaced apart from the first wire pattern 114 in the third direction, and a third wire pattern 118 may be spaced apart from the second wire pattern 116 in the third direction.

The first to third wire patterns 114, 116, and 118 may penetrate the first to third gate electrodes G1 to G3. The first to third gate electrodes G1 to G3 may surround the outer peripheral surfaces of the first to third wire patterns 114, 116, and 118.

For example, as illustrated in FIG. 13, the cross sections of the first to third wire patterns 114, 116, and 118 may be rectangular. In another example, the cross sections of the first to third wire patterns 114, 116, and 118 may be different polygons or circles, respectively. In some embodiments, the widths of the first to third wire patterns 114, 116, and 118 may decrease, as they go away from the first surface 100a of the substrate 100.

Although only a fin-shaped transistor (FinFET) including a channel region of a fin-shaped pattern and a transistor including a channel region of a wire pattern (nanowire or nanosheet) have been described as a semiconductor device according to some embodiments, these are only examples. As another example, the semiconductor device according to some embodiments may include a tunneling FET, a VFET (Vertical FET), a CFET (Complementary FET) or a three-dimensional (3D) transistor. Alternatively, the semiconductor device according to some embodiments may include a bipolar junction transistor, a laterally-diffused metal-oxide semiconductor (LDMOS), and the like.

Figure 15:
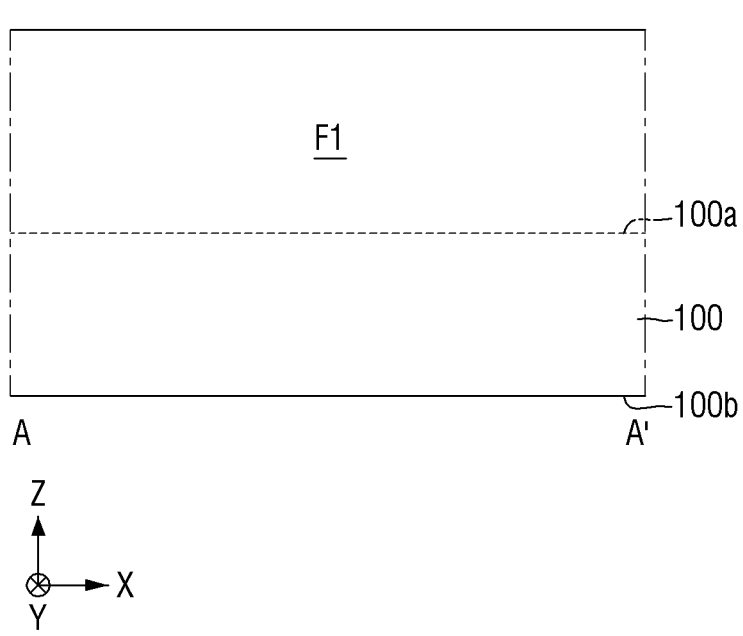
FIGS. 15 to 21 are views of stages in a method for fabricating a semiconductor device according to some embodiments.
Figure 16:
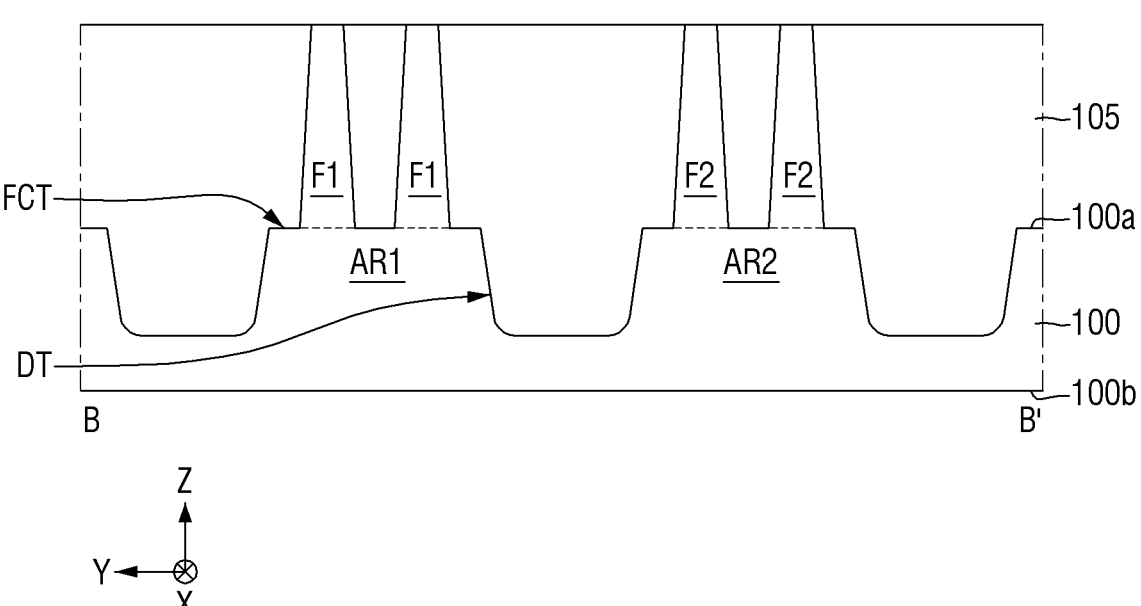
Figure 17:
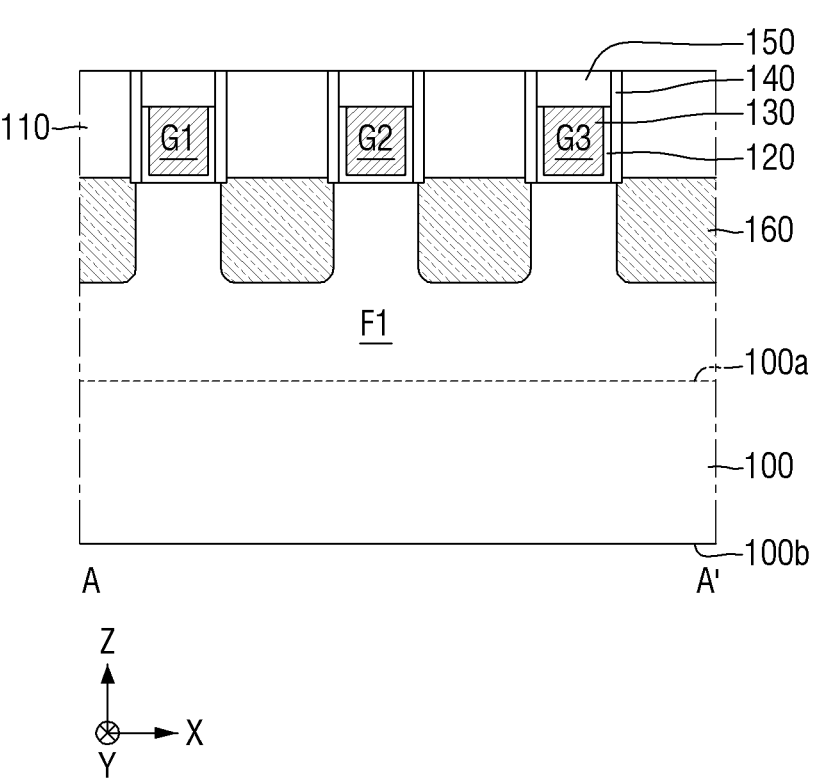

FIGS. 15 to 21 illustrate stages in a method for fabricating a semiconductor device according to some embodiments. FIGS. 15 and 17 are cross-sectional views taken along line A-A' of FIG. 1, and FIGS. 16 and 18 to 21 are cross-sectional views taken along line B-B' of FIG. 1.

Referring to FIGS. 15 and 16, the fin cut trench FCT extending in the first direction, e.g., in the X-direction, may be formed on the substrate 100. The first and second active patterns F1 and F2 may be defined by the fin cut trench FCT. As a result, the first and second active patterns F1 and F2 protruding from the first surface 100a of the substrate 100 may be formed. The first and second active patterns F1 and F2 may be arranged in the second direction, e.g., in the Y-direction.

The substrate trench DT that defines the first active region AR1 and the second active region AR2 may be formed on the substrate 100. Therefore, the active pattern in the region in which the substrate trench DT is formed may be removed. The substrate trench DT may be formed at a depth deeper than or equal to that of the fin cut trench FCT.

The field insulating film 105 may be formed on the first surface 100a of the substrate 100. The field insulating film 105 may fill the substrate trench DT and the fin cut trench FCT. The field insulating film 105 may wrap at least a part of the first and second active patterns F1 and F2.

Figure 18:
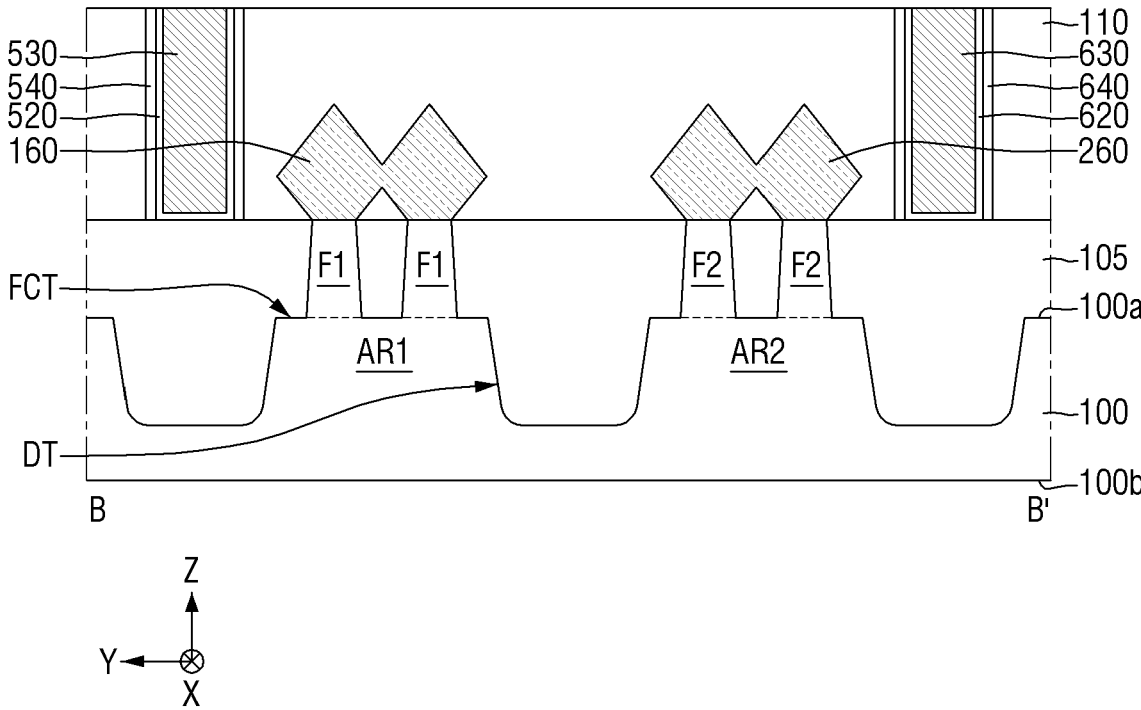

Referring to FIGS. 17 and 18, the first and third gate electrodes G1 to G3 and the first and second landing pads 530 and 630 may be formed on the first and second active patterns F1 and F2 and the field insulating film 105. The gate spacer 140 and the first and second spacers 540 and 640 may be formed, and the gate dielectric film 120 and the first and second dielectric films 520 and 620 may be formed.

The upper surfaces of the first and second landing pads 530 and 630 may be placed on the same plane as the upper surface of the gate capping pattern 150. That is, the first and second landing pads 530 and 630 may be formed by the process of forming the first to third gate electrodes G1 to G3, e.g., the first and second landing pads 530 and 630 may be formed simultaneously and of the same materials as the first to third gate electrodes G1 to G3. The first and second landing pads 530 and 630 may be formed by a process of patterning the gate electrodes G1 to G3. For example, the gate conductive film 130 and the first and second landing pads 530 and 630 may be formed, e.g., simultaneously, by a replacement process.

The first and second source/drain regions 160 and 260 may be formed in the first and second active patterns F1 and F2. Each of the first and second source/drain regions 160 and 260 may be formed inside each of the first and second active patterns F1 and F2.

A first front interlayer insulating film 110 that covers the field insulating film 105 and the first and second source/drain regions 160 and 260 may be formed. The upper surface of the first front interlayer insulating film 110 may be placed on the same plane as the upper surfaces of the first to third gate electrodes G1 to G3 and the upper surfaces of the first and second landing pads 530 and 630.

Figure 19:
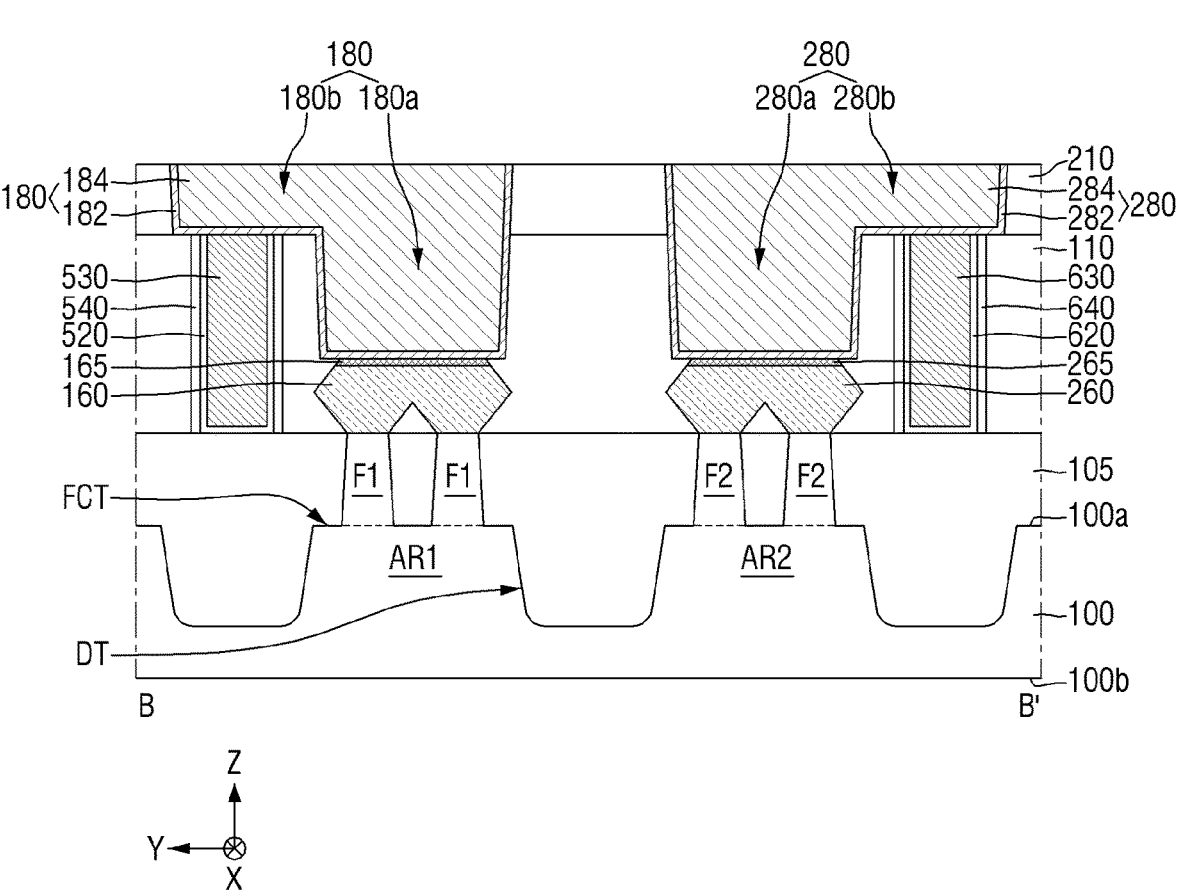

Referring to FIG. 19, the second front interlayer insulating film 210 may be formed on the first front interlayer insulating film 110. The first source/drain contact 180 including the first portion 180a and the second portion 180b, and the second source/drain contact 280 including the first portion 280a and the second portion 280b may be formed. The first portion 180a of the first source/drain contact 180 may be connected to the first source/drain region 160, and the first portion 280a of the second source/drain contact 280 may be connected to the second source/drain region 260. The second portion 180b of the first source/drain contact 180 may be connected to the first landing pad 530, and the second portion 280b of the second source/drain contact 280 may be connected to the second landing pad 630. The first silicide film 165 may be formed at an interface between the first source/drain region 160 and the first source/drain contact 180. The second silicide film 265 may be formed at an interface between the second source/drain region 260 and the second source/drain contact 280.

Figure 20:
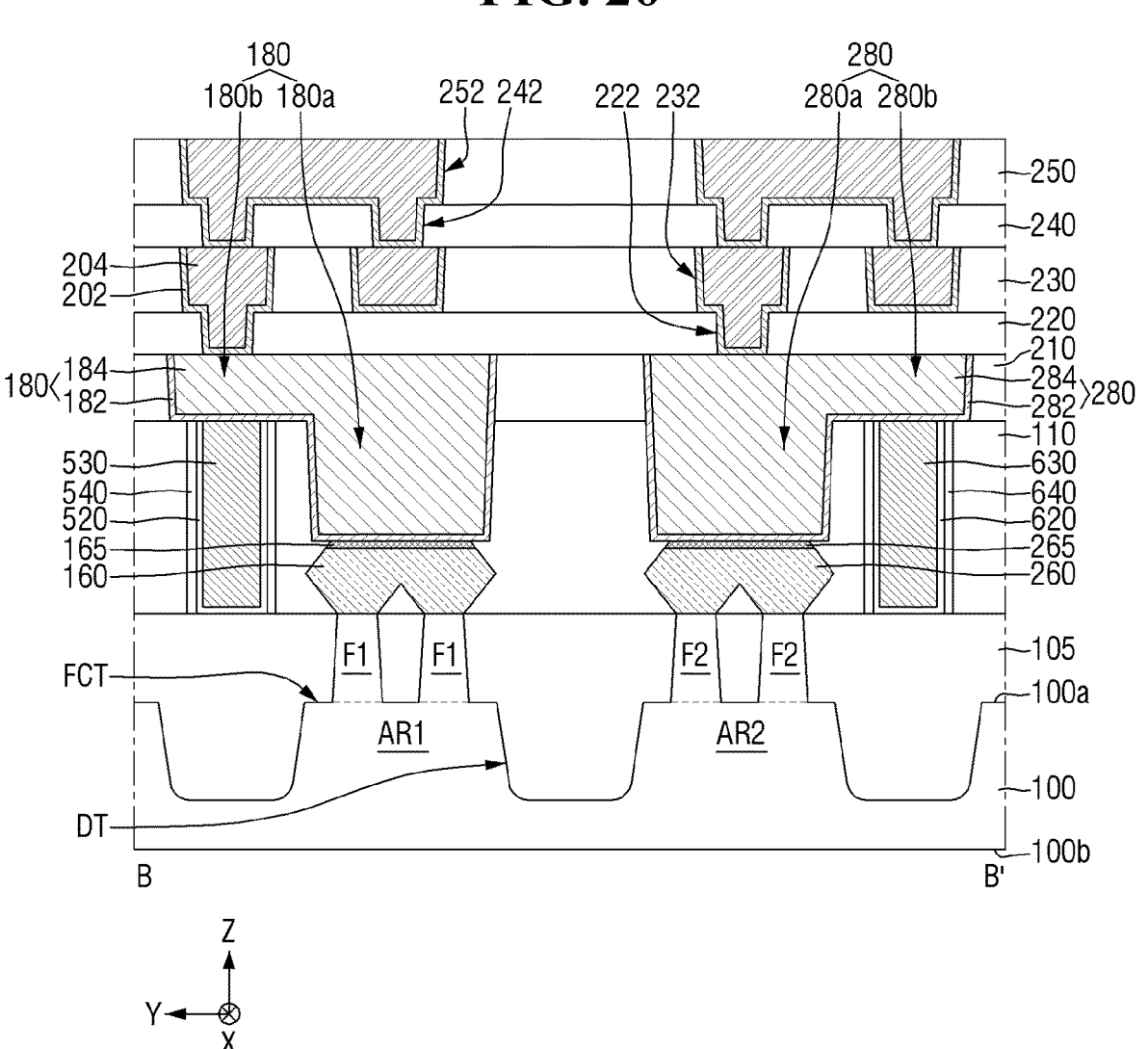

Referring to FIG. 20, the third to sixth front interlayer insulating films 220, 230, 240, and 250, the first and second front vias 222 and 242, and the first and second front wirings 232 and 252 may be formed on the second front interlayer insulating film 210.

Figure 21:
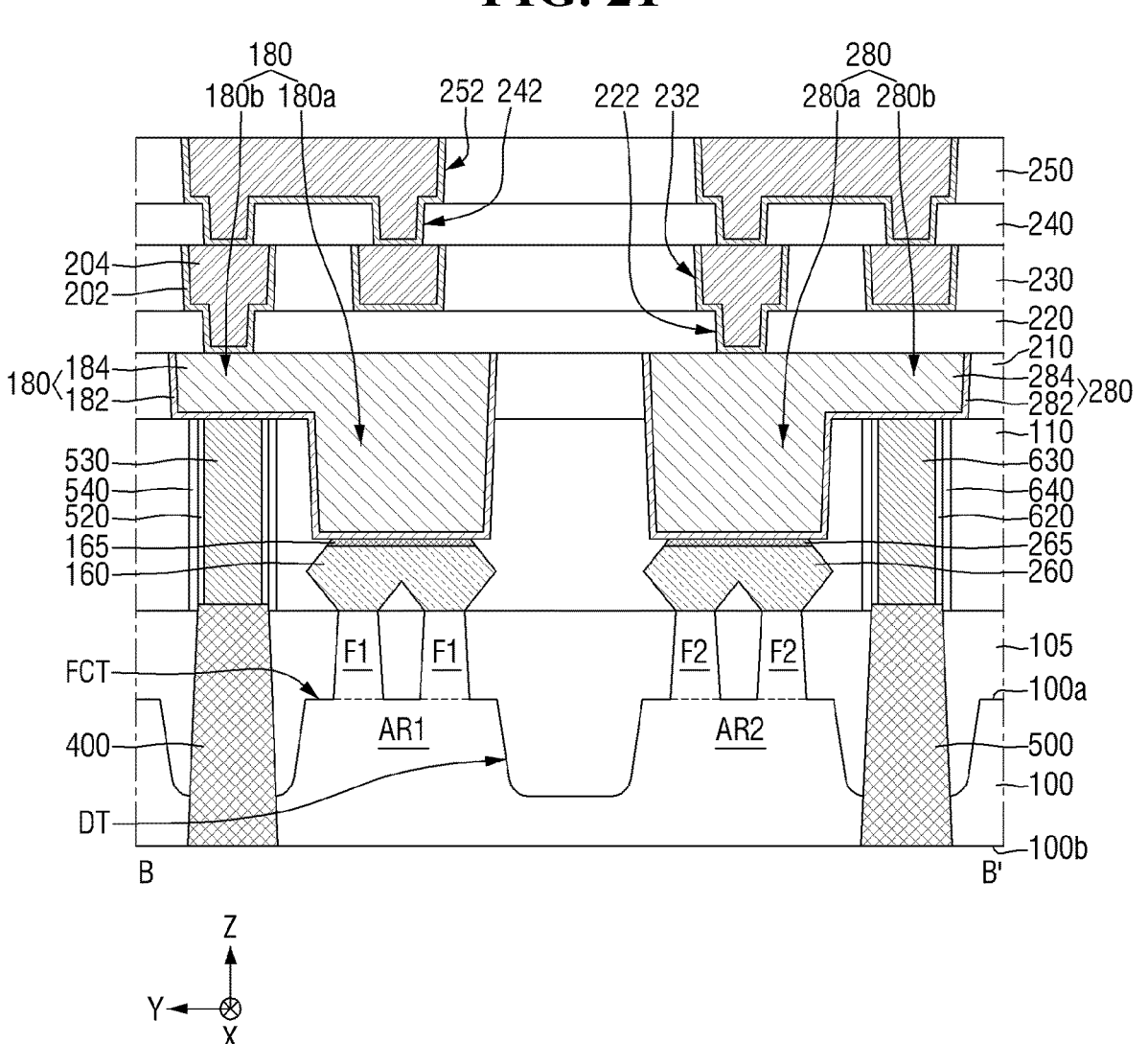

Referring to FIG. 21, the first and second through vias 400 and 500 may be formed from the second surface 100b of the substrate 100 toward the first surface 100a. The first and second through vias 400 and 500 may penetrate the substrate 100 and the field insulating film 105. The first through via 400 penetrates at least a part of the first landing pad 530, the first dielectric film 520, and the first spacer 540. Therefore, the first through via 400 may be connected to the first landing pad 530. The second through via 500 may penetrate at least a part of the second landing pad 630, the second dielectric film 620, and the second spacer 640. As a result, the second through via 500 may be connected to the second landing pad 630.

In the process of forming the first through via 400, at least a part of the first dielectric film 520 placed on the bottom surface of the first landing pad 530 may be removed. In addition, at least a part of the first spacer 540 may be removed. That is, unlike the example shown in the drawing, a part of the first spacer 540 may be removed, or a part of the first dielectric film 520 placed on the bottom surface of the first landing pad 530 may remain. In the process of forming the second through via 500, at least a part of the second dielectric film 620 placed on the bottom surface of the second landing pad 630 may be removed. In addition, at least a part of the second spacer 640 may be removed. That is, unlike the example shown in the drawing, a part of the second spacer 640 may be removed, or a part of the second dielectric film 620 placed on the bottom surface of the second landing pad 630 may remain.

Referring to FIG. 3, the first back interlayer insulating film 310 and the first and second power rails 312 and 314 may be formed on the second surface 100b of the substrate 100. The second to fifth back interlayer insulating films 320, 330, 340, and 350, the first and second back vias 322 and 342, and the first and second back wirings 332 and 352 may be formed on the first back interlayer insulating film 310. As a result, the first and second power rails 312 and 314 and the power delivery network may be formed on the second surface 100b of the substrate 100.

By way of summation and review, embodiments provide a semiconductor device having improved power, performance, and area (PPA). That is, embodiments provide a power rail on a back side of the substrate, i.e. a surface opposite to a surface supporting active patterns (i.e., fins), such that a through via extends through, e.g., an entire thickness of, the substrate to connect a landing pad to the power rail.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first surface and a second surface, the first surface and the second surface being opposite to each other;
   an active pattern extending in a first direction on the first surface of the substrate;
   a source/drain contact including a first portion and a second portion, the first portion being connected to a source/drain region of the active pattern, and the second portion extending from the first portion in the first direction or in a second direction intersecting the first direction;
   a power rail on the second surface of the substrate, the power rail being configured to provide a voltage to the substrate;
   a through electrode connected to the power rail and penetrating the substrate; and
   a landing pad connecting the through electrode and the second portion of the source/drain contact,
   wherein the second portion of the source/drain contact overlaps the landing pad in a third direction that is perpendicular to the first surface of the substrate, and
   wherein a lowermost surface of the first portion of the source/drain contact is at a lower level in the third direction than a lowermost surface of the second portion of the source/drain contact.

2. The semiconductor device as claimed in claim 1, further comprising:
   a gate electrode extending in the second direction on the active pattern,
   wherein the landing pad includes a same material as the gate electrode, and wherein an uppermost surface of the landing pad is at a higher level than an uppermost surface of the source/drain region.

3. The semiconductor device as claimed in claim 1, further comprising:

a gate electrode extending in the second direction on the active pattern; and a gate capping pattern on the gate electrode, wherein an upper surface of the landing pad is coplanar with an upper surface of the gate capping pattern.

4. The semiconductor device as claimed in claim 1, further comprising a spacer on a side wall of the landing pad.

5. The semiconductor device as claimed in claim 4, further comprising a dielectric layer between the spacer and the side wall of the landing pad.

6. The semiconductor device as claimed in claim 1, further comprising:

a field insulating film wrapping at least a part of a side wall of the active pattern on the first surface of the substrate, wherein the through electrode penetrates the substrate and the field insulating film, and wherein the landing pad is on the field insulating film.

7. The semiconductor device as claimed in claim 6, wherein an upper surface of the through electrode is above an uppermost surface of the field insulating film.

8. The semiconductor device as claimed in claim 1, wherein:

the substrate further includes an active region defined by a substrate trench, the active pattern is on the active region, and the landing pad overlaps a field insulating film that fills the substrate trench in the third direction.

9. The semiconductor device as claimed in claim 8, wherein the second portion of the source/drain contact extends from the first portion in the second direction, the second portion being in contact with the landing pad.

10. The semiconductor device as claimed in claim 1, wherein:

the active pattern includes a first active pattern and a second active pattern that are spaced apart from each other in the first direction, the first active pattern and the second active pattern being separated by a fin cut trench, and the landing pad overlaps a field insulating film that fills the fin cut trench in the third direction.

11. The semiconductor device as claimed in claim 10, wherein the second portion of the source/drain contact extends from the first portion in the first direction, the second portion being in contact with the landing pad.

12. The semiconductor device as claimed in claim 10, further comprising:

a first gate electrode extending in the second direction on the first active pattern and the field insulating film, the first gate electrode wrapping an end of the first active pattern; and a second gate electrode extending in the second direction on the second active pattern and the field insulating film, the second gate electrode wrapping an end of the second active pattern, wherein the landing pad is between the first gate electrode and the second gate electrode.

13. The semiconductor device as claimed in claim 10, further comprising:

a first gate electrode extending in the second direction on the first active pattern; and a second gate electrode extending in the second direction on the second active pattern, wherein the source/drain region includes a first source/drain region on one side of the first gate electrode at an end of the first active pattern, and a second source/drain region on another side of the second gate electrode at an end of the second active pattern, and wherein the fin cut trench is between the first source/drain region and the second source/drain region.

14. A semiconductor device, comprising:

a substrate including a first surface and a second surface, the first surface and the second surface being opposite to each other;

a first active pattern extending in a first direction on the first surface of the substrate;

a second active pattern extending in the first direction on the first surface of the substrate, the second active pattern being spaced apart from the first active pattern in a second direction intersecting the first direction;

a third active pattern extending in the first direction on the first surface of the substrate, the third active pattern being spaced apart from the first active pattern in the first direction;

a gate electrode extending in the second direction on the first active pattern and the second active pattern;

a source/drain contact connected to a source/drain region on one side of the gate electrode of the first active pattern in the first direction;

a power rail on the second surface of the substrate, the power rail being configured to provide a voltage to the substrate;

a through electrode connected to the power rail and penetrating the substrate; and a landing pad in contact with the source/drain contact and the through electrode, the landing pad being between the first active pattern and the third active pattern in the first direction, wherein the source/drain contact includes a first portion that is in contact with the source/drain region, and a second portion that extends from the first portion in the first direction, and is in contact with the landing pad.

15. The semiconductor device as claimed in claim 14, wherein a width of the landing pad in the first direction is the same as a width of the gate electrode in the first direction.

16. The semiconductor device as claimed in claim 14, wherein a width of the landing pad in the first direction is different from a width of the gate electrode in the first direction.

17. The semiconductor device as claimed in claim 14, wherein the gate electrode wraps around an end of the first active pattern.

18. The semiconductor device as claimed in claim 14, further comprising:

an element separation structure separating the first active pattern and the third active pattern and is spaced apart from the gate electrode in the first direction, and wherein the landing pad is on the element separation structure between the first active pattern and the third active pattern.

19. The semiconductor device as claimed in claim 14, wherein the first active pattern and the third active pattern are separated by a fin cut trench, and wherein the landing pad overlaps a field insulating film that fills the fin cut trench in a direction perpendicular to the first surface of the substrate.

20. A semiconductor device, comprising:

a substrate including a first surface and a second surface, the first surface and the second surface being opposite to each other;

an active pattern extending in a first direction on the first surface of the substrate;

a field insulating film wrapping at least part of a side wall of the active pattern;

a gate electrode extending in a second direction intersecting the first direction, on the active pattern;

a source/drain contact including a first portion connected to a source/drain region of the active pattern, and a second portion extending from the first portion in the first direction or the second direction;

a silicide film between the source/drain region and the source/drain contact;

a power rail on the second surface of the substrate, the power rail being configured to provide a voltage to the substrate;

a back wiring on the second surface of the substrate and connected to the power rail;

a through electrode connected to the power rail and penetrating the substrate and the field insulating film;

a landing pad on the field insulating film, the landing pad being in contact with the through electrode and the second portion of the source/drain contact, and the landing pad including a same material as the gate electrode; and a front wiring on the first surface of the substrate and connected to the source/drain contact, wherein an upper surface of the through electrode is above uppermost surface of the field insulating film.

* * * * *